United States Patent
Morgan et al.

(10) Patent No.: US 12,482,969 B2
(45) Date of Patent: Nov. 25, 2025

(54) CABLE ASSEMBLY FOR A CABLE CONNECTOR MODULE

(71) Applicants: TE Connectivity Solutions GmbH, Schaffhausen (CH); TYCO ELECTRONICS JAPAN G.K., Kawasaki (JP)

(72) Inventors: Chad William Morgan, Carneys Point, NJ (US); Bruce Allen Champion, Camp Hill, PA (US); John Joseph Consoli, Harrisburg, PA (US); Hirotate Kadobayashi, Kawasaki (JP)

(73) Assignee: TE CONNECTIVITY SOLUTIONS GmbH ET AL., Schaffhausen (CH)

( * ) Notice: Subject to any disclaimer, the term of this patent is extended or adjusted under 35 U.S.C. 154(b) by 222 days.

(21) Appl. No.: 17/879,147

(22) Filed: Aug. 2, 2022

(65) Prior Publication Data

US 2024/0047909 A1   Feb. 8, 2024

(51) Int. Cl.
| | |
|---|---|
| H01R 12/71 | (2011.01) |
| H01R 12/52 | (2011.01) |
| H01R 13/516 | (2006.01) |
| H01R 13/6592 | (2011.01) |
| H01R 13/6594 | (2011.01) |
| H05K 1/11 | (2006.01) |

(52) U.S. Cl.
CPC ........... *H01R 12/716* (2013.01); *H01R 12/52* (2013.01); *H01R 13/516* (2013.01); *H01R 13/6592* (2013.01); *H01R 13/6594* (2013.01); *H05K 1/117* (2013.01)

(58) Field of Classification Search
None
See application file for complete search history.

(56) References Cited

U.S. PATENT DOCUMENTS

| | | |
|---|---|---|
| 5,176,538 A | 1/1993 | Hansel, III |
| 5,522,731 A | 6/1996 | Clark |
| 6,217,372 B1 | 4/2001 | Reed |
| 6,238,246 B1 | 5/2001 | Ferrill et al. |
| 6,926,551 B1 | 8/2005 | Schulz |
| 6,986,679 B1 | 1/2006 | Aronson |
| 8,002,572 B2 | 8/2011 | Lu et al. |
| 8,840,432 B2 | 9/2014 | Alden, III et al. |
| 8,845,365 B2 | 9/2014 | Schroll et al. |
| 9,124,009 B2 | 9/2015 | Atkinson et al. |
| 9,166,320 B1 | 10/2015 | Herring et al. |
| 9,203,193 B2 | 12/2015 | Hackman et al. |
| 9,437,949 B2 | 9/2016 | Behziz et al. |
| 9,793,692 B1 | 10/2017 | Pogash et al. |
| 9,819,166 B1 | 11/2017 | Capozzi |
| 9,985,367 B2 | 5/2018 | Wanha et al. |
| 10,170,862 B2 | 1/2019 | Weidner et al. |
| 10,411,374 B2 | 9/2019 | Tanaka et al. |

(Continued)

*Primary Examiner* — Oscar C Jimenez

(57) ABSTRACT

A cable connector module includes a circuit card having signal contact pads on an upper surface and signal mating pads on a lower surface configured to be mated with interposer contacts of a socket connector. Signal vias extend directly through the circuit card electrically connecting the signal contact pads and the corresponding signal mating pads in the shortest path possible. The cable connector module includes cable assemblies terminated to the upper surface having a cable and a ground structure coupled to an end of the cable.

20 Claims, 11 Drawing Sheets

(56) References Cited

U.S. PATENT DOCUMENTS

| | | | |
|---|---|---|---|
| 10,535,956 B2 | 1/2020 | Henry et al. | |
| 10,741,941 B2 | 8/2020 | Wu et al. | |
| 11,189,943 B2 | 11/2021 | Zerebilov et al. | |
| 11,785,731 B1* | 10/2023 | Morgan | H05K 5/0026 |
| | | | 174/545 |
| 11,924,970 B2* | 3/2024 | Morgan | H01R 12/716 |
| 2002/0057360 A1 | 5/2002 | Abe et al. | |
| 2005/0239300 A1 | 10/2005 | Yasumura | |
| 2009/0283318 A1 | 11/2009 | Bonga et al. | |
| 2011/0177719 A1 | 7/2011 | Martin | |
| 2012/0052720 A1 | 3/2012 | David | |
| 2013/0242513 A1 | 9/2013 | Masuda et al. | |
| 2013/0280955 A1 | 10/2013 | Alden, III et al. | |
| 2014/0321061 A1 | 10/2014 | Moore | |
| 2015/0194751 A1 | 7/2015 | Herring | |
| 2015/0303601 A1 | 10/2015 | Jeon | |
| 2015/0311612 A1 | 10/2015 | Qiao | |
| 2016/0049746 A1 | 2/2016 | Gross | |
| 2016/0093966 A1 | 3/2016 | Behziz | |
| 2016/0276759 A1 | 9/2016 | Tran et al. | |
| 2017/0164498 A1 | 6/2017 | Song et al. | |
| 2017/0179707 A1 | 6/2017 | Gutgold et al. | |
| 2017/0194744 A1 | 7/2017 | Guetig | |
| 2018/0042148 A1 | 2/2018 | Sasaki et al. | |
| 2018/0120906 A1 | 5/2018 | Reed et al. | |
| 2018/0309215 A1* | 10/2018 | Harmon, III | H01R 13/62988 |
| 2018/0366852 A1 | 12/2018 | Yang | |
| 2019/0027870 A1 | 1/2019 | Lloyd | |
| 2019/0044258 A1 | 2/2019 | Everest et al. | |
| 2019/0288457 A1 | 9/2019 | Champion | |
| 2020/0015385 A1 | 1/2020 | Bucher | |
| 2020/0036117 A1 | 1/2020 | Little et al. | |
| 2020/0153135 A1 | 5/2020 | Rossman | |
| 2020/0262368 A1 | 8/2020 | Lunde | |
| 2020/0301084 A1 | 9/2020 | Champion et al. | |
| 2021/0091496 A1 | 3/2021 | Cartier, Jr. et al. | |
| 2021/0234291 A1 | 7/2021 | Zerebilov | |
| 2021/0274673 A1 | 9/2021 | Blackburn | |
| 2021/0305740 A1 | 9/2021 | Mongold | |
| 2021/0307204 A1 | 9/2021 | Lu | |
| 2021/0376507 A1* | 12/2021 | Guo | H01R 13/629 |
| 2021/0408731 A1 | 12/2021 | Li et al. | |
| 2022/0022785 A1 | 1/2022 | Funderburk et al. | |
| 2022/0102881 A1* | 3/2022 | Lloyd | H05K 1/117 |
| 2022/0151095 A1* | 5/2022 | Blackburn | H05K 7/1061 |
| 2022/0200210 A1 | 6/2022 | Balakrishnan | |
| 2022/0239042 A1 | 7/2022 | Cheng | |
| 2022/0320775 A1 | 10/2022 | Kato | |
| 2022/0329014 A1* | 10/2022 | Zi | H01R 12/75 |
| 2022/0368041 A1 | 11/2022 | Kiuchi et al. | |
| 2022/0376441 A1 | 11/2022 | He et al. | |
| 2023/0299538 A1 | 9/2023 | Mizumura | |
| 2024/0039188 A1 | 2/2024 | Briant | |
| 2024/0047907 A1 | 2/2024 | Champion et al. | |
| 2024/0047908 A1 | 2/2024 | Morgan | |
| 2024/0047909 A1 | 2/2024 | Morgan | |
| 2024/0047910 A1 | 2/2024 | Morgan | |
| 2024/0047911 A1 | 2/2024 | Morgan | |
| 2024/0049394 A1 | 2/2024 | Morgan | |
| 2024/0063585 A1* | 2/2024 | Shah | H01R 12/716 |
| 2024/0313478 A1 | 9/2024 | Diaz | |

* cited by examiner

CABLE ASSEMBLY FOR A CABLE CONNECTOR MODULE

BACKGROUND OF THE INVENTION

The subject matter herein relates generally to communication systems.

There is an ongoing trend toward smaller, lighter, and higher performance communication components and higher density systems, such as for ethernet switches or other system components. Typically, the system includes an electronic package coupled to a circuit board, such as through a socket connector. Electrical signals are routed between the electronic package and the circuit board. The electrical signals are then routed along traces on the circuit board to another component, such as a transceiver connector. The long electrical paths through the host circuit board reduce electrical performance of the system. Additionally, losses are experienced between the connector interfaces and along the electrical signal paths of the transceivers. Conventional systems are struggling with meeting signal and power output from the electronic package. Some known systems utilize an electronic assembly having cable assemblies to transmit the signals along cables rather than signal traces along the host circuit board. However, the electronic assembly includes numerous cables terminated to a circuit card. There is a need to increase the density of the cables and the contact pads on the circuit card to reduce the overall size of the electronic assembly. However, there are limits to spacing of the contact pads to allow routing of the cables from the circuit card with conventional cable termination techniques. For example, ample spacing is needed between rows of the circuit cards to allow routing of the cables along the circuit card. Additionally, as data speeds increase, the grounding structure at the interface between the cables and the circuit card is proving ineffective, particularly at higher frequencies.

BRIEF DESCRIPTION OF THE INVENTION

In one embodiment, a cable connector module is provided and includes a circuit card having an upper surface and a lower surface. The circuit card includes signal contact pads on the upper surface. The signal contact pads are arranged in pairs. The circuit card includes signal mating pads on the lower surface. The signal mating pads configured to be mated with interposer contacts of a socket connector. The circuit card includes signal vias extending directly through the circuit card between the upper and lower surface to electrically connect the signal contact pads and the corresponding signal mating pads in the shortest path possible. The cable connector module includes cable assemblies terminated to the upper surface of the circuit card. Each cable assembly includes a cable and a ground structure coupled to an end of the cable.

In another embodiment, a cable connector module is provided and includes a circuit card having an upper surface and a lower surface. The circuit card includes signal contact pads on the upper surface. The signal contact pads are arranged in pairs. The circuit card includes ground contact pads on the upper surface. The circuit card includes signal mating pads on the lower surface. The circuit card includes ground mating pads on the lower surface. The signal mating pads and the ground mating pads are configured to be mated with interposer contacts of a socket connector. The circuit card includes signal vias extending through the circuit card between the upper and lower surface to electrically connect the signal contact pads and the corresponding signal mating pads. The circuit card includes ground vias extending through the circuit card between the upper and lower surface to electrically connect the ground contact pads and the ground mating pads. The cable connector module includes cable assemblies terminated to the upper surface of the circuit card. Each cable assembly includes a cable and a ground clip coupled to an end of the cable. The ground clip couples the cable to the upper surface of the circuit card. The cable has an insulator holding a first signal conductor and a second signal conductor. The cable has a cable shield surrounding the insulator. The first and second signal conductors have exposed portions extending forward of an end of the insulator at an end of the cable soldered to corresponding signal contact pads. The cable includes drain wires at the end of the cable. The drain wires are soldered to corresponding ground contact pads. The ground clip includes a window that receives the exposed portions of the first and second signal conductors therethrough. The ground clip includes a mounting tab configured to be mounted to the circuit card to fix the ground clip relative to the circuit card and electrically connect the ground clip to the circuit card. The ground clip includes a lower grounding tab being electrically connected to a lower portion of the cable shield. The ground clip includes an upper grounding tab being electrically connected to an upper portion of the cable shield. The ground clip includes a cable pocket between the lower grounding tab and the upper grounding tab. The cable pocket extends in a cable exit direction angled transverse relative to the mounting surface of the circuit card.

In a further embodiment, a cable connector module is provided and includes a housing having a cavity. The cable connector module includes a circuit card received in the cavity. The circuit card has an upper surface and a lower surface. The circuit card includes signal contact pads on the upper surface. The signal contact pads are arranged in pairs. The circuit card includes signal mating pads on the lower surface. The signal mating pads configured to be mated with interposer contacts of a socket connector. The circuit card includes signal vias extending through the circuit card between the upper and lower surface to electrically connect the signal contact pads and the corresponding signal mating pads. The cable connector module includes cable assemblies terminated to the upper surface of the circuit card. Each cable assembly includes a cable and a ground clip coupled to an end of the cable. The ground clip couples the cable to the upper surface of the circuit card. The cable has an insulator holding a first signal conductor and a second signal conductor. The cable has a cable shield surrounding the insulator. The first and second signal conductors have exposed portions extending forward of an end of the insulator at an end of the cable soldered to corresponding signal contact pads. The ground clip includes a bottom ground rake below the cable and a top ground hood above the cable. The bottom ground rake includes a window that receives the exposed portions of the first and second signal conductors therethrough. The bottom ground rake includes a mounting tab configured to be mounted to the circuit card to fix the bottom ground rake relative to the circuit card and electrically connect the bottom ground rake to the circuit card. The bottom ground rake includes a lower grounding tab being electrically connected to a lower portion of the cable shield. The top ground hood includes an upper grounding tab being electrically connected to an upper portion of the cable shield. The ground clip includes a cable pocket between the lower grounding tab and the upper grounding tab. The cable pocket extends in a cable exit direction angled transverse relative to the mounting surface of the circuit card.

DETAILED DESCRIPTION OF THE INVENTION

Figure 1:
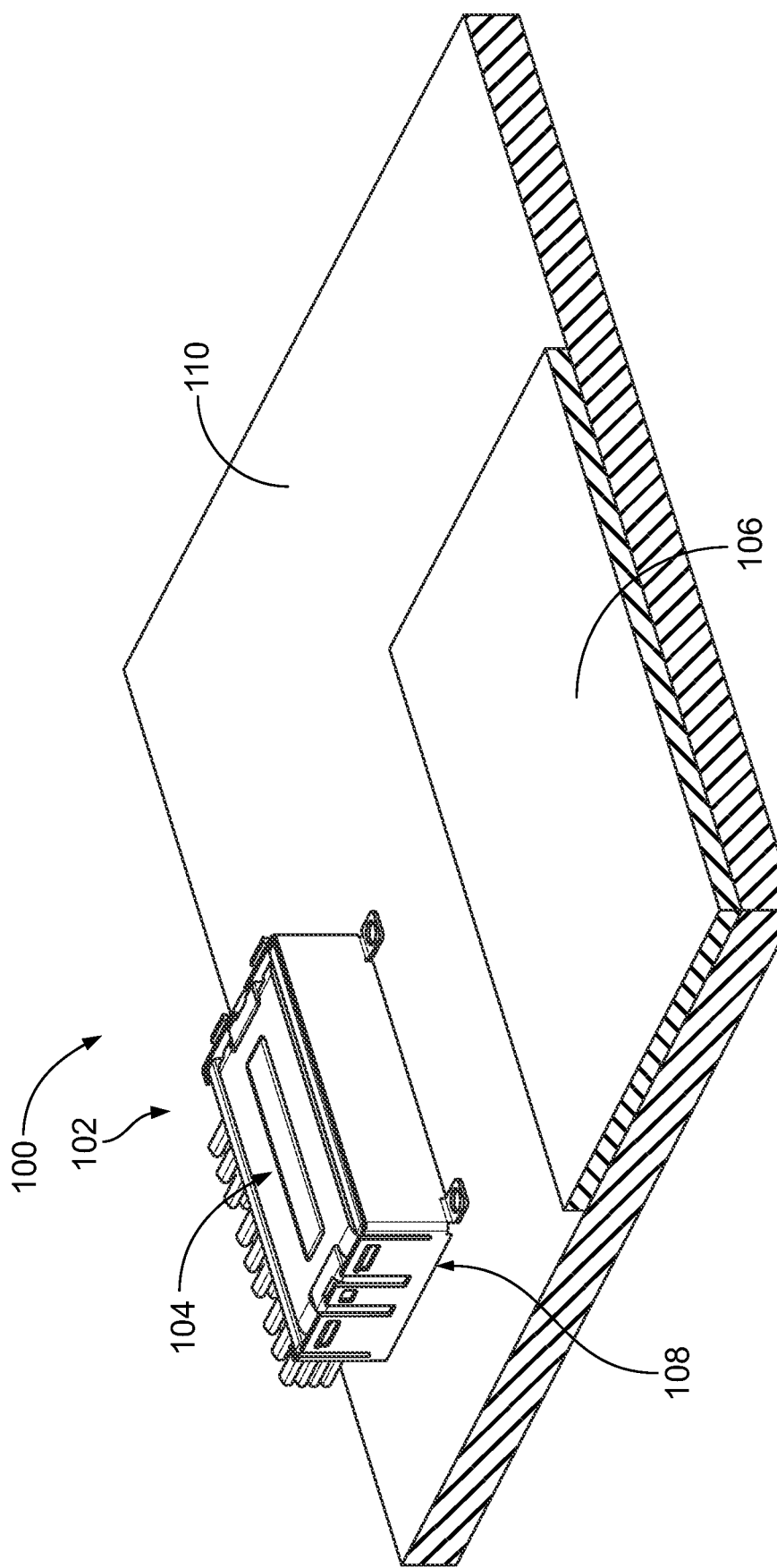
FIG. 1 is a front perspective view of a communication system having an electronic assembly in accordance with an exemplary embodiment.
Figure 2:
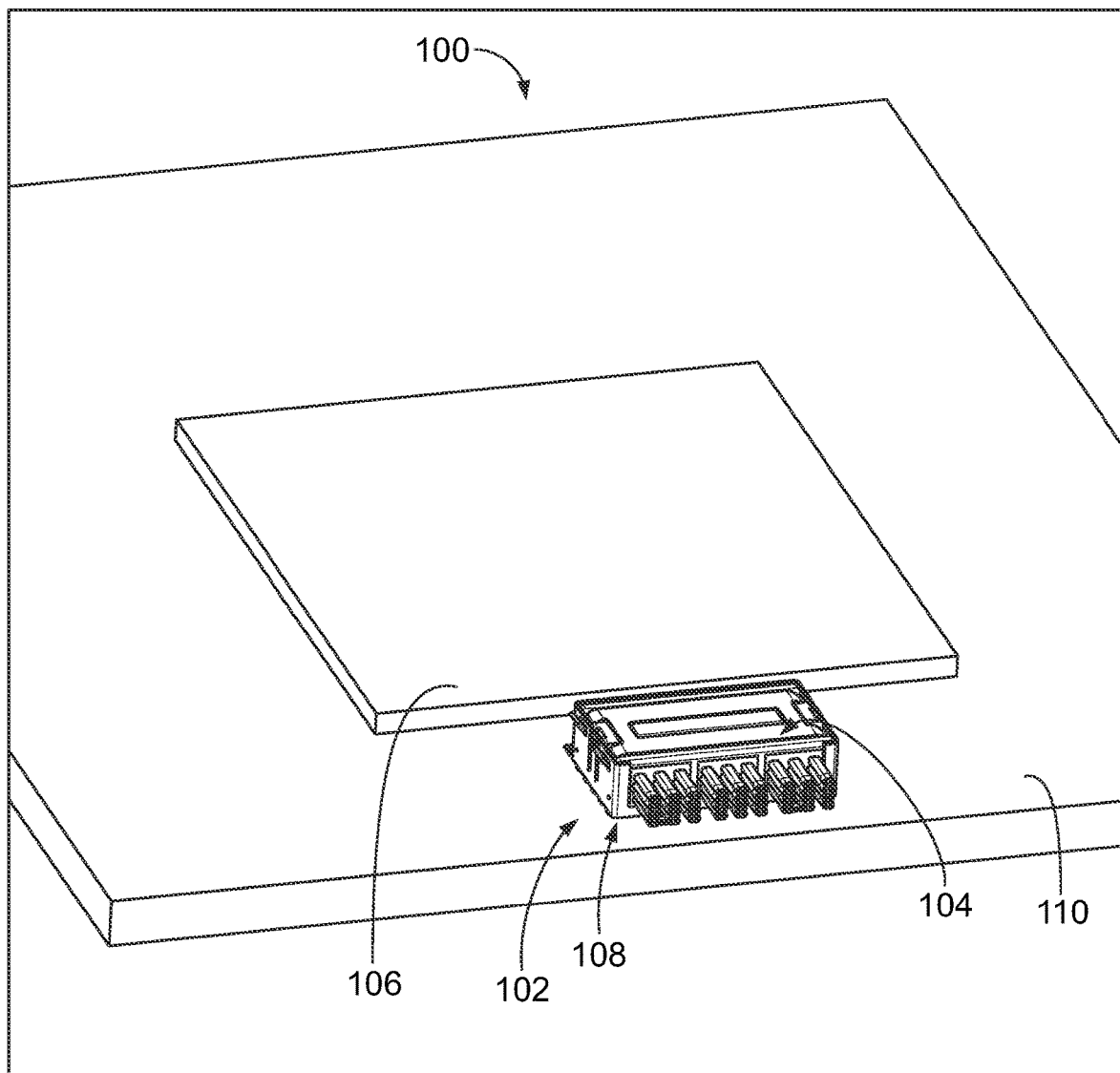
FIG. 2 is a rear perspective view of a communication system having an electronic assembly in accordance with an exemplary embodiment.

FIG. 1 is a front perspective view of a communication system 100 having an electronic assembly 102 in accordance with an exemplary embodiment. FIG. 2 is a rear perspective view of a communication system 100 having an electronic assembly 102 in accordance with an exemplary embodiment. The electronic assembly 102 includes one or more socket assemblies 108 and corresponding cable connector modules 104 (one set shown in FIGS. 1 and 2). The socket assembly 108 is used to electrically connect the corresponding cable connector module 104 to a circuit board 110. An electronic package 106 is electrically connected to the circuit board 110. The cable connector modules 104 are electrically connected to the electronic package 106 through the socket assemblies 108 and the circuit board 110.

One electronic assembly 102 (socket assembly 108 and corresponding cable connector module 104) is shown on one side of the electronic package 106 in FIGS. 1 and 2. However, it should be understood that electronic assemblies 102 may be provided at more than one side, such as all four sides, in alternative embodiments. In various embodiments, a plurality of electronic assemblies 102 may be provided at the side(s) of the electronic package 106. In various embodiments, the cable connector modules 104 are electrical modules using electrical conductors to transmit electrical data signals.

In various embodiments, the electronic package 106 may be an integrated circuit assembly, such as an ASIC. However, the electronic package 106 may be another type of communication component. The electronic package 106 may be mounted directly to the circuit board 110. For example, the electronic package 106 may be soldered to the circuit board 110.

In an exemplary embodiment, compression elements are used to load the cable connector modules 104 against the socket assemblies 108 to electrically connect the cable connector modules 104 to the socket assemblies 108 and to electrically connect the socket assemblies 108 to the circuit board 110. For example, the compression elements may include springs that press the components downward to load the socket assemblies 108 and create mechanical and electrical connections between the cable connector modules 104 and the socket assemblies 108. In various embodiments, the cable connector modules 104 are individually clamped or compressed against the socket assemblies 108 by the compression elements and are thus individually serviceable and removable from the socket assemblies 108.

In an exemplary embodiment, the communication system 100 includes heat dissipating elements (not shown) to dissipate heat from the electronic package 106 and/or the cable connector modules 104.

Figure 3:
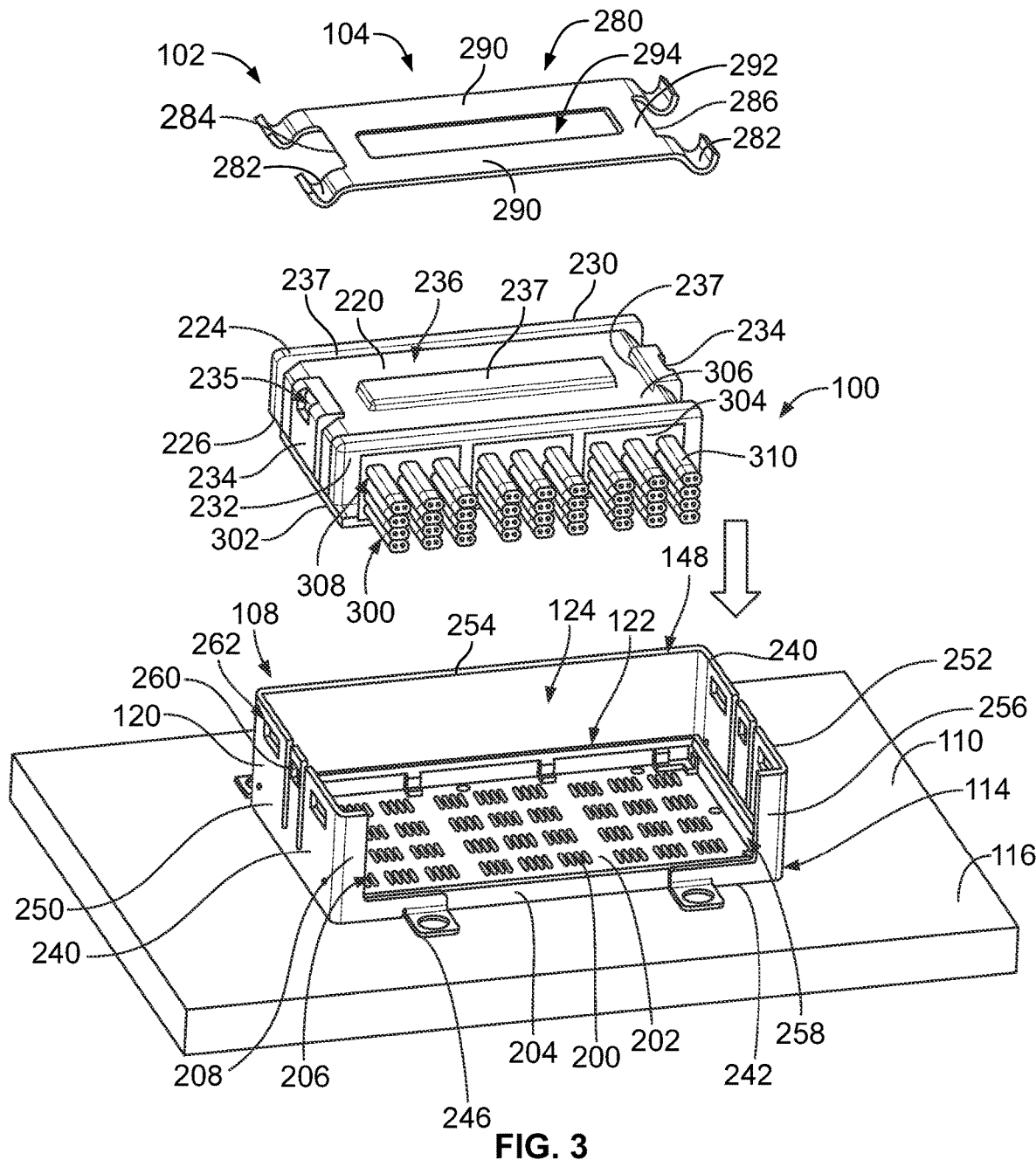
FIG. 3 is an exploded view of the communication system in accordance with an exemplary embodiment showing the electronic assembly and the circuit board.

FIG. 3 is an exploded view of the communication system 100 in accordance with an exemplary embodiment showing the electronic assembly 102 and the circuit board 110. The electronic assembly 102 includes the cable connector module 104 and the socket assembly 108. The socket assembly 108 is used to electrically connect the cable connector module 104 to the circuit board 110. In the illustrated embodiment, the cable connector module 104 is an electrical module having a plurality of cables terminated within the cable connector module 104.

The circuit board 110 includes a mounting area 114 on an upper surface 116 of the circuit board 110. The socket assembly 108 is coupled to the circuit board 110 at the mounting area 114. The mounting area 114 may be located adjacent to the electronic package 106 (shown in FIG. 1). The circuit board 110 includes board contacts (not shown) at the mounting area 114. The board contacts are arranged in an array, such as in rows and columns. The board contacts may be pads or traces of the circuit board 110. The board contacts may be high speed signal contacts, low speed signal contacts, ground contacts, or power contacts. The board contacts may include pairs of high-speed signal board contacts surrounded by a ring or fence of ground board contacts.

In an exemplary embodiment, the cable connector module 104 includes a connector housing 220 holding a circuit card 302 and a plurality of cable assemblies 300 terminated to the circuit card 302. Each cable assembly 300 includes a cable 310 and a support structure for the cable 310. The support structure is used to couple an end of the cable 310 to the circuit card 302. In an exemplary embodiment, the cable connector module 104 includes a cable holder 304 that holds the cable assemblies 300 relative to the circuit card 302.

The connector housing 220 includes a housing cavity 222 that holds the cable assemblies 300 and the circuit card 302. The connector housing 220 may be a metal shell or cage that receives the cable assemblies 300. Alternatively, the connector housing 220 may be a plastic molded component. In an exemplary embodiment, the housing 220 extends between a top 224 and a bottom 226. The circuit card 302 is provided at the bottom 226. The housing 220 extends between a front 230 and a rear 232. The housing 220 includes sides 234 between the front 230 and the rear 232. The housing includes latching features 235 at the sides 234. The housing 220 includes a pocket 236 at the top 224. The housing 220 may include guide ribs 237 at the top 224 that define the pocket 236. The guide ribs 237 may be located at the front 230 and/or the rear 232 and/or the sides 234. Optionally, at least one of the guide ribs 237 may be approximately centered along the top 224.

In an exemplary embodiment, the socket assembly 108 includes a cage 120 and a socket connector 122 arranged in a cavity 124 of the cage 120. The cavity 124 receives the cable connector module 104 to mate with the socket connector 122 of the socket assembly 108. The cage 120 guides mating of the cable connector module 104 with the socket connector 122.

In an exemplary embodiment, the cage 120 is a stamped and formed cage configured to be stamped and formed from a metal sheet. The cage 120 includes cage walls 240 defining the cavity 124. The cage walls 240 extend between a top 242 and a bottom 244 of the cage 120. The bottom 244 is configured to be coupled to the circuit board 110. In an exemplary embodiment, the cage 120 includes mounting tabs 246 configured to be mounted to the circuit board 110. The mounting tabs 246 may extend from the bottom 244. The mounting tabs 246 may include openings configured to receive fasteners, such as threaded fasteners, used to couple the cage 120 to the circuit board 110. Other types of mounting tabs may be used in alternative embodiments, such as press fit pins, weld tabs, solder tabs, slips, latches, threaded openings, or other types of mounting features. In alternative embodiments, separate securing features may be used to secure the cage 120 to the circuit board 110. In an exemplary embodiment, the cage 120 includes a top opening 148 at the top 242. The top opening 148 is configured to receive the cable connector module 104. For example, the cable connector module 104 is top loaded into the cavity 124 through the top opening 148.

In an exemplary embodiment, the cage 120 includes side walls 250, 252 and end walls 254, 256. The side walls 250, 252 may be shorter than the end walls 254, 256. In the illustrated embodiment, the end wall 256 includes an opening 258. The opening 258 is configured to receive a portion of the cable connector module 104, such as the cables. In an exemplary embodiment, the cage 120 includes latching features 260 used for latchably coupling to the cable connector module 104. For example, the latching features 260 interface with the latches 235 of the housing 220 of the cable connector module 104. The latching features 260 may be deflectable latches. Other types of latching features may be used in alternative embodiments, such as latch openings. The latching features 260 are provided at the side walls 250, 252 in the illustrated embodiment. However, the latching features 260 may be provided at other locations in alternative embodiments. In an exemplary embodiment, the cage 120 includes openings 262 in alternative embodiments. The openings 262 are provided at the side walls 250, 252 in the illustrated embodiment. However, the openings 262 may be provided at other locations in alternative embodiments.

In an exemplary embodiment, the electronic assembly 102 includes a spring clip 280 used to couple the cable connector module 104 to the socket connector 122. The spring clip 280 is configured to engage the cable connector module 104 to hold the cable connector module 104 in the cavity 124 of the cage 120. In an exemplary embodiment, the spring slip 280 is received in the pocket 236. The spring clip 280 engages the top 230 and presses against the top 230. The guide ribs 237 may locate the spring clip 280 relative to the housing 220. The spring clip 280 presses the cable connector module 104 toward the socket connector 122 to electrically connect the cable connector module 104 to the socket connector 122.

The spring clip 280 includes latches 282 at first and second sides 284, 286 of the spring clip 280. The latches 282 are used to secure the sprint clip 280 to the cage 120. The latches 282 may be coupled to the side walls 250, 252, such as to the openings 262.

The spring clip 280 includes at least one spring beam 290, such as a pair of spring beams 290. The spring beams 290 extend between the first side 284 and the second side 286 of the spring clip 290. The spring beams 290 are connected by connecting beams 292. The spring beams 290 are curved, such as being curved downward to engage the cable connector module 104. The spring beams 290 are received in the pocket 236, such as between the guide ribs 237. Windows 294 are defined between the spring beams 290. The windows 284 may receive corresponding guide ribs 237.

The socket connector 122 includes an array of interposer contacts 200 held together by a substrate 202. The socket connector 122 may include a frame 204 holding the substrate 202. The frame 204 may be rectangular. The frame 204 is configured to be coupled to the cage 120. Additionally, or alternatively, the frame 204 may be coupled to the circuit board 110. In an exemplary embodiment, the frame 204 includes an opening 206 that receives the substrate 202. The substrate 202 may fill the opening 206. The opening 206 may receive a portion of the cable connector module 104, such as for mating with the interposer contacts 200. The frame 204 includes frame members 208 defining the opening 206. In the illustrated embodiment the frame 204 is rectangular having the frame members 208 arranged around the perimeter of the frame 204 (for example, in a rectangular configuration). The frame 204 is configured to be coupled to the cage 120 and/or the circuit board 110.

In various embodiments, the substrate 202 is a printed circuit board including the interposer contacts 200 coupled to the printed circuit board. The interposer contacts 200 may be defined by circuits, traces, vias, and the like of the printed circuit board. The interposer contacts 200 may be separate contacts soldered to the printed circuit board.

In other embodiments, the substrate 202 is a film or plate and the interposer contacts 200 are separate contacts which may be held by or coupled to the film. The substrate 202 is manufactured from an insulative material, such as a polyimide material, to electrically isolate the interposer contacts 200 from one another.

In an exemplary embodiment, the interposer contacts 200 are compressible contacts. In various embodiments, the interposer contacts 200 may be stamped and formed contacts, such as dual compression contacts having spring beams at both ends of the contacts and main bodies of the contacts between the spring beams held in the substrate 202. The interposer contacts 200 may be LGA contacts.

In various embodiments, the interposer contacts 200 are conductive polymer columns. The conductive polymer contacts may be conductive elastomeric connectors having conductive (metallic) particles embedded in an elastomeric material, such as a silicone rubber material. Each interposer contact 200 includes an upper mating interface and a lower mating interface. In various embodiments, the interposer contacts 200 are dual compressible contacts that are compressible at both the upper mating interface and the lower mating interface, such as for mating with the cable connector module 104 and the circuit board 110, respectively. Optionally, the interposer contacts 200 may be arranged in groups, with each group including a pair of signal contacts surrounded by a ring or fence of ground contacts. The groups are arranged in rows and columns. Other arrangements are possible in alternative embodiments.

Figure 15:
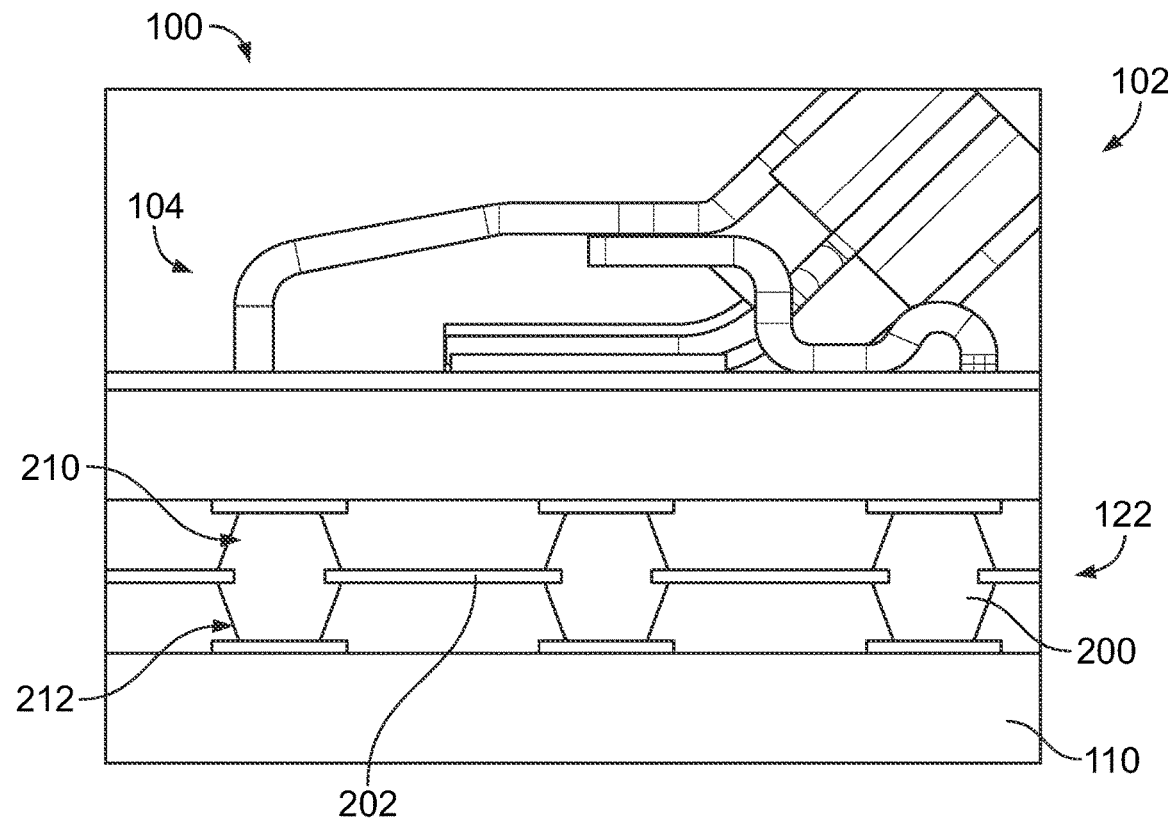
FIG. 15 is a cross sectional view of the communication system in accordance with an exemplary embodiment showing the electronic assembly and the circuit board.

FIG. 15 is a cross sectional view of the communication system 100 in accordance with an exemplary embodiment showing the electronic assembly 102 and the circuit board 110. The cable connector module 104 is coupled to the socket connector 122. The cable connector module 104 is pressed against the socket connector 122 by the spring clip 280 (FIG. 3) to electrically connect the cable connector module 104 to the socket connector 122. The cable connector module 104 is pressed downward to compress the interposer contacts 200 of the socket connector 122. In an exemplary embodiment, the interposer contacts 200 are dual compression contacts that are compressible at the upper interface (for example, with the cable connector module 104) and at the lower interface (for example, with the circuit board 110).

Each interposer contact 200 includes an upper contact portion 210 and a lower contact portion 212. The upper contact portion 210 is compressible. The upper contact portion 210 is configured to be coupled to the corresponding mating contact (not shown) at the bottom of the cable connector module 104. The lower contact portion 212 is compressible. The lower contact portion 212 is configured to be terminated to the board contact (not shown) at the upper surface of the circuit board 110. In the illustrated embodiment, the interposer contacts 200 are conductive polymer columns, such as conductive elastomeric connectors. The interposer contacts 200 are held by the substrate 202. The upper contact portions 210 extend above the substrate 202 for connection to the cable connector module 104. The lower contact portions 212 extend below the substrate 202 for connection to the circuit board 110.

Figure 16:
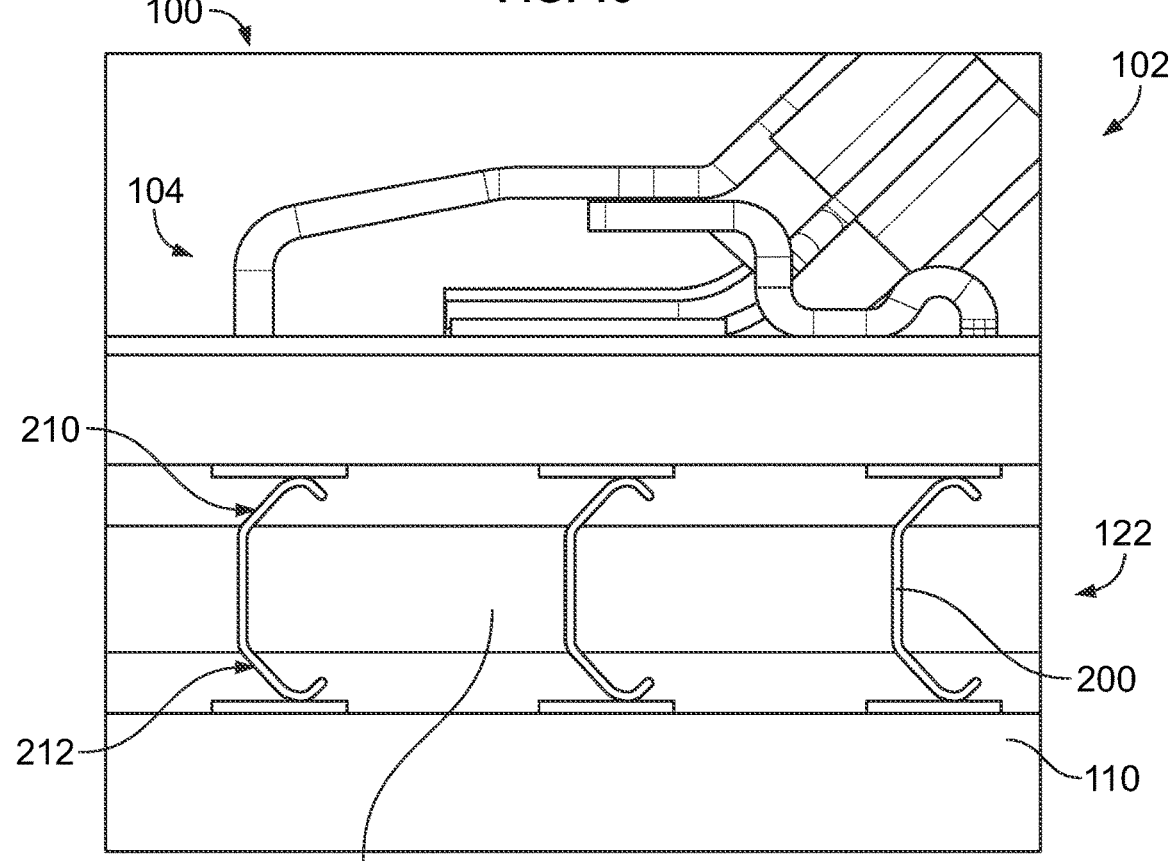
FIG. 16 is a cross sectional view of the communication system in accordance with an exemplary embodiment showing the electronic assembly and the circuit board.

FIG. 16 is a cross sectional view of the communication system 100 in accordance with an exemplary embodiment showing the electronic assembly 102 and the circuit board 110. The cable connector module 104 is coupled to the socket connector 122. The cable connector module 104 is pressed against the socket connector 122 by the spring clip 280 (FIG. 3) to electrically connect the cable connector module 104 to the socket connector 122. The cable connector module 104 is pressed downward to compress the interposer contacts 200 of the socket connector 122. In an exemplary embodiment, the interposer contacts 200 are dual compression contacts that are compressible at the upper interface (for example, with the cable connector module 104) and at the lower interface (for example, with the circuit board 110).

Each interposer contact 200 includes the upper contact portion 210 and the lower contact portion 212. The upper and lower contact portions 210, 212 are compressible. In the illustrated embodiment, the interposer contacts 200 are stamped and formed contacts. The interposer contacts 200 may be LGA contacts. The interposer contacts 200 include upper spring beams at the upper contact portions 210. The interposer contacts 200 include lower spring beams at the lower contact portions 212. The upper and lower spring beams compressible. Main bodies of the interposer contacts 200 are held by the substrate 202. The interposer contacts 200 may include other shapes or features in alternative embodiments. The upper contact portions 210 extend above the substrate 202 for connection to the cable connector module 104. The lower contact portions 212 extend below the substrate 202 for connection to the circuit board 110.

Figure 4:
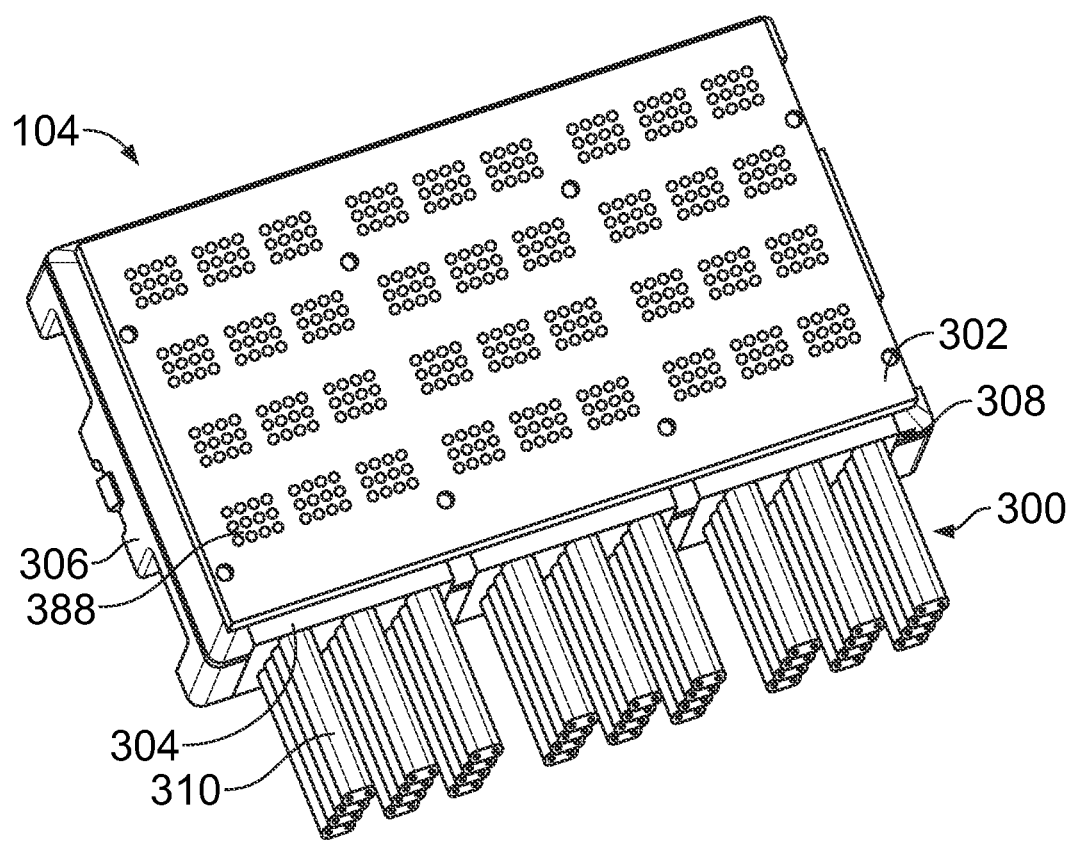
FIG. 4 is a bottom perspective view of the cable connector module 104 in accordance with an exemplary embodiment.

With reference back to FIG. 3, and with additional reference to FIG. 4, which is a bottom perspective view of the cable connector module 104, the cable connector module 104 includes the cable assemblies 300 terminated to the circuit card 302, such as being soldered to the circuit card 302. The circuit card 302 includes mating pads 388 at a bottom of the circuit card 302. The mating pads 388 are configured to be mated with corresponding interposer contacts 200 when the cable connector module 104 is plugged into the socket connector 122. Optionally, the mating pads 388 may be arranged in groups, with each group including a pair of signal pads surrounded by a ring or fence of ground pads. The groups are arranged in rows and columns. Other arrangements are possible in alternative embodiments.

Each cable assembly 300 includes a cable 310 and a support structure for the cable 310. The support structure is used to couple an end of the cable 310 to the circuit card 302. The cable connector module 104 may include a heat transfer element (not shown) thermally coupled to the cable assembly 300, such as to dissipate heat from components on the circuit card 302.

In an exemplary embodiment, the cable connector module 104 includes a cable holder 304 that holds the cable assemblies 300 relative to the circuit card 302. The cable connector module 104 includes a connector housing 306 having a cavity 308 that holds the cable assemblies 300 and the circuit card 302. The connector housing 306 holds the circuit card 302 for mating with the socket assembly 108. The connector housing 306 may be a metal shell or cage that receives the cable assembly 300. The connector housing 306 is configured to be coupled to the socket connector 122, such as to the frame 204, to position the mating interface of the circuit card 302 relative to the socket connector 122 for mating to the interposer contacts 200. The cage 120 positions the connector housing 306, and thus the circuit card 302, in the cavity 124 for mating with the socket connector 122.

The cable holder 304 is coupled to the cables 310 and holds the cables 310 relative to each other within the cavity 308 of the connector housing 306. The cable holder 304 may be coupled to the circuit card 302 to hold the cables 310 relative to the circuit card 302. The cable holder 304 provides strain relief for the cables 310. In alternative embodiments, the cable assembly 300 may be provided without the cable holder 304. Rather, the cables 310 may be unsupported or freely arranged in the connector housing 306. The circuit card 302 is coupled to the connector housing 306 to position the mating interface of the circuit card 302 for mating with the socket assembly 108. The cable holder 304 is coupled to the connector housing 306 to position the cables 310 relative to the connector housing 306.

Figure 5:
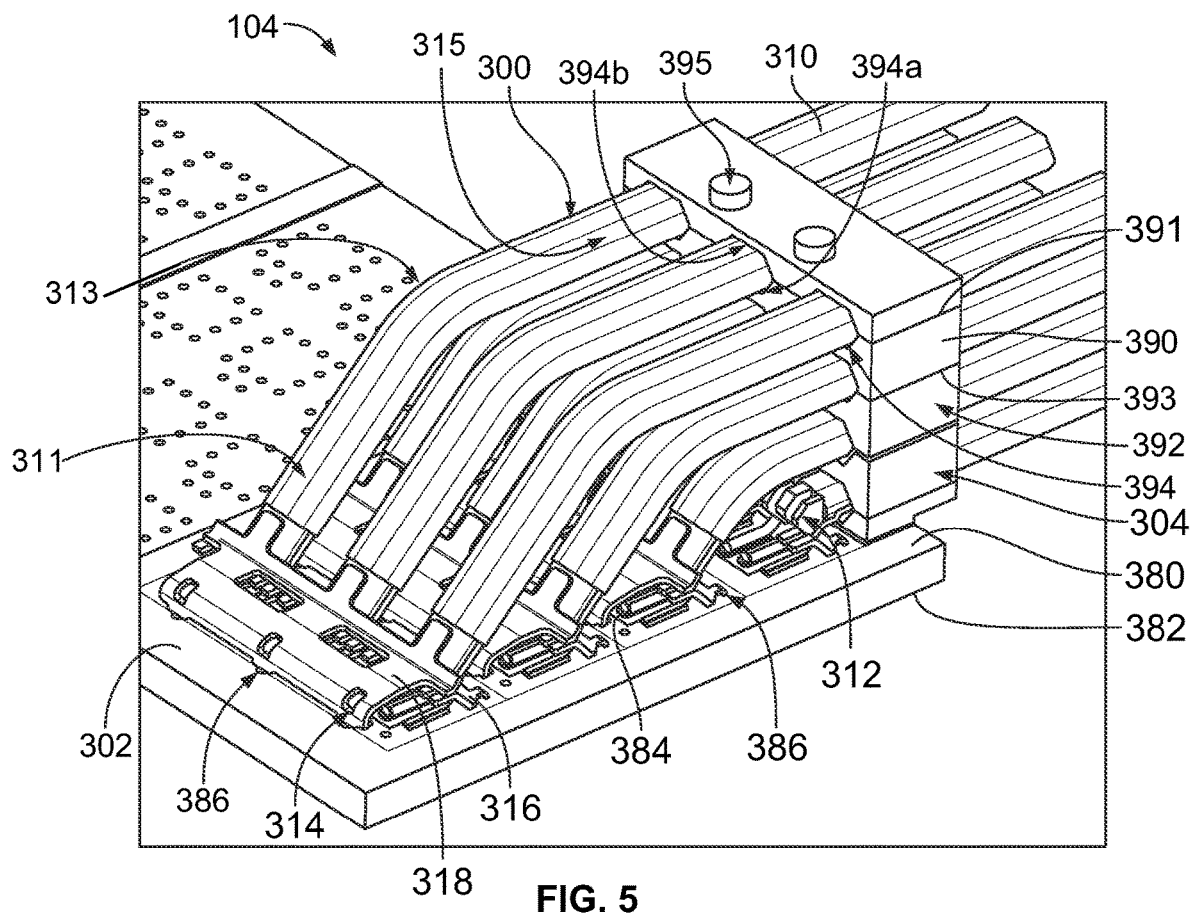
FIG. 5 is a top perspective view of a portion of the cable connector module in accordance with an exemplary embodiment.

FIG. 5 is a top perspective view of a portion of the cable connector module 104 in accordance with an exemplary embodiment. FIG. 5 shows a plurality of the cable assemblies 300 terminated to the circuit card 302. The cable assemblies 300 are supported by the cable holder 304. The connector housing 306 (shown in FIG. 3) is removed to illustrate the cable assemblies 300 and the circuit card 302.

In the illustrated embodiment, the cable assemblies 300 are stacked in multiple rows, such as three or more rows. In various embodiments, the cable connector module 104 may include at least thirty-six (36) cable assemblies 300 terminated to the circuit card 302 in an area of approximately 30 mm by 20 mm. For example, the cable assemblies 300 may be arranged in a 4×9 matrix. However, the cable connector module 104 may include greater or fewer cable assemblies 300 in the termination area in alternative embodiments. The termination area may be larger or smaller in alternative embodiments, which may include greater or fewer cable assemblies 300 in alternative embodiments. The cable assemblies 300 may be grouped together, such as in three or more groups (only one group is illustrated in FIG. 5). Each group of cable assemblies 300 are terminated to a pad or section of the circuit card.

The circuit card 302 includes an upper surface 380 and a lower surface 382 opposite the upper surface 380. In an exemplary embodiment, the circuit card 302 includes contact pads 384 at the upper surface 380 configured to be electrically connected to the signal conductors of cables 310. The contact pads 384 are circuits of the circuit card 302 and may be connected to plated vias extending through the circuit card 302 to the lower surface 382. The contact pads 384 may be arranged in groups, such as pairs. In the illustrated embodiment, the contact pads 384 are all provided on the upper surface 380. However, in alternative embodiments, the contact pads 384 may additionally be provided on the lower surface 382. Optionally, the contact pads 384 may be arranged in a ground-signal-signal-ground arrangement. In the illustrated embodiment, the contact pads 384 are provided in multiple rows along the circuit card 302. The rows are aligned parallel to the front and the rear of the circuit card 302. The circuit card 302 is densely populated with the contact pads 384 to allow a large number of cables 310, and thus a large number of signal lines, to be electrically connected to the circuit card 302.

In an exemplary embodiment, the circuit card 302 includes ground vias 386 at the upper surface 380. The ground vias 386 are located proximate to the contact pads 384. The ground vias 386 are electrically connected to the ground plane. The cable assemblies 300 are coupled to the corresponding ground vias 386.

The circuit card 302 includes mating pads 388 (shown in FIG. 4) at the lower surface 382 configured to be electrically connected to corresponding interposer contacts 200 of the socket assembly 108 (both shown in FIG. 3). The mating pads 388 are electrically connected to corresponding contact pads 384 through plated vias or other circuits of the circuit card 302. In an exemplary embodiment, the mating pads 388 are all provided on the lower surface 382. However, the mating pads 388 may be provided on both the upper surface 380 and the lower surface 382 in alternative embodiments, such as when the circuit card 302 is a pluggable card configured to be plugged into a card slot of a receptacle connector.

In an exemplary embodiment, each cable assembly 300 includes the cable 310, a conductor support 312 coupled to the end of the cable 310, and a ground structure 314 used to electrically connect the cable 310 to the circuit card 302. In various embodiments, the ground structure 314 is a ground clip and may be referred to hereinafter as a ground clip 314. The ground clip 314 is coupled to the end of the cable 310. The ground clip 314 and the conductor support 312 support the cable 310 relative to the circuit card 302. For example, the ground clip 314 and the conductor support 312 hold the cable 310 at an angle relative to the circuit card 302 to allow the cable 310 to lift off of and away from the circuit card 302, rather than laying flat or parallel to the circuit card 302. Such an arrangement allows tighter packaging of the cable assemblies 300, such as to increase the density of the cable connector module 104 for a given footprint of the circuit card 302. Other types of ground structures 314 may be used in alternative embodiments to electrically connect the cable 310 to the circuit card 302, such as a bus bar, a crimp barrel, a ground cage, or ground hood, and the like. The ground structure 314 may be a stamped and formed structure.

The ground clip 314 is used to mechanically and electrically connect the cable 310 to the circuit card 302. In an exemplary embodiment, the ground clip 314 is a multi-piece structure. For example, the ground clip 314 may include multiple stamped and formed pieces that are stamped and formed separately from each other and then coupled together, such as being welded together to form the ground clip 314. In the illustrated embodiment, the ground clip 314 includes a bottom ground rake 316 and a top ground hood 318. Optionally, the top ground hood 318 of multiple cable assemblies 300, such as the cable assemblies within each row, may be ganged or integrated together as a single top ground hood. However, in alternative embodiments, each cable assembly 300 may include a separate top ground hood 318.

In an exemplary embodiment, the ground clip 314 is used to direct the cable 310 away from the circuit card 302, such as at a predetermined cable exit angle. For example, the ground clip 314 may hold the cable 310 at a cable exit angle that is non-parallel to the circuit card 302 and non-perpendicular to the circuit card 302. In various embodiments, the ground clip 314 may hold the cable 310 at a cable exit angle of between 30° and 60°. Optionally, the ground clip 314 may hold the cable 310 at a cable exit angle of approximately 45°. The ground clip 314 holds the cable 310 at an angle to allow tight spacing of the cable assemblies 300. For example, the contact pads on the circuit card 302 may be more densely populated (for example, closer spacing) by forcing the cable 310 to exit at an angle from the circuit card 302 as compared to conventional cable connector modules having the cables oriented generally parallel to the circuit card for termination to the circuit card.

In an exemplary embodiment, the ground clip 314 is used to electrically connect to the cable 310, such as to improve electrical performance of the cable connector module 104. For example, the ground clip 314 may reduce excess insertion loss and cross talk due to tighter control of electromagnetic fields at the termination area. The ground clip 314 may electrically connect to the cable 310 at multiple locations. For example, the ground clip 314 may electrically connect at the top, the bottom and both sides to provide nearly circumferential connection between the cable 310 and the ground clip 314. The ground clip 314 positions the cable 310 to have a short ground return path between the cable 310 and the circuit card 302 for improved electrical characteristics.

Each cable 310 extends between the ground clip 314 and the cable holder 304. The cables 310 transition between the ground clips 314 and the cable holder 304. For example, the cables 310 lift off of the circuit card 302 immediately rearward of the termination area and extend rearward to the cable holder 304. The cables 310 are stacked in rows in the cable holder 304. In an exemplary embodiment, the cable holder 304 is coupled to the circuit card 302 to hold the cables 310 relative to the circuit card 302. The cable holder 304 provides strain relief for the cables 310. The cables 310 are exposed to air between the cable holder 304 and the ground clips 314.

The circuit card 302 is coupled to the connector housing 306 to position the mating interface of the circuit card 302 for mating with the socket assembly 108. The cable holder 304 is coupled to the connector housing 306 to position the cables 310 relative to the connector housing 306. In alternative embodiments, the cable assembly 300 may be provided without the cable holder 304. Rather, the cables 310 may be unsupported or freely arranged in the connector housing 306.

In an exemplary embodiment, the cable holder 304 includes cable supports 390 arranged in a cable support stack 392. The cable supports 390 hold the cables 310 at elevated positions above the circuit card 302. For example, the cable supports 390 hold the cables 310 at different heights above the upper surface 380 of the circuit card 302. In an exemplary embodiment, each cable support 390 extends between a top 391 and a bottom 393. The cable supports 390 are stacked bottom-to-top on top of each other. The cable supports 390 may include locating features 395 for locating the cable supports 390 within the cable support stack 392. For example, the locating features 395 may be posts and openings where the posts are received in openings to position and/or secure the cable supports 390 together. In alternative embodiments, the cable holder 304 may be a single piece structure that holds the cables 310 rather than multiple, stacked cable supports 390.

In an exemplary embodiment, the cable holder 304 includes cable channels 394 therethrough that receive corresponding cables 310. The cable channels 394 are arranged in multiple rows. In the illustrated embodiment, the cable supports 390 include the cable channels 394 that receive corresponding cables 310. The cable channels 394 may be open at the top 391 and the bottom 393 of each cable support 390 to receive corresponding cables 310 along both the top 391 and the bottom 393 of the cable support 390. For example, the cable channels 394 include upper cable channels 394a at the top 391 and lower cable channels 394b at the bottom 393. Optionally, the cables 310 may be sandwiched between the cable supports 390. Alternatively, the cable channels 394 may be contained within the cable supports 390, such as with each cable support 390 entirely circumferentially surrounding the corresponding cable channels 394.

In an exemplary embodiment, the cables 310 extend forward of the cable supports 390 to the ground clips 314. The cables 310 may be preformed into a particular shape between the cable supports 390 and the ground clips 314. For example, bends may be formed in the cables 310 at predetermined locations (lengths forward of the cable supports 390 and/or rearward from the ends of the cables 310). The cables 310 may be shape-retaining to retain the preformed bend between the cable holder 304 and the ground clip 314. Each row of cables 310 may have different shapes (for example, bends at different locations).

In the illustrated embodiment, the cables 310 each have a horizontal portion immediately forward of the cable supports 390 and an angled portion between the horizontal portion and the ground clip 314. In various embodiments, the angled portion is angled between approximately 150° and 120° relative to the horizontal portion. The angled portion may be angled at approximately 135° relative to the horizontal portion. In an exemplary embodiment, each cable 310 includes an end portion 311, a bend portion 313 rearward of the end portion 311, and a support portion 315 rearward of the bend portion 313. The cable 310 is bent and non-linear in the bend portion 313. The cable 310 is generally straight (linear) along the end portion 311 and the support portion 315. The end portion 311 extends between the bend portion 313 and the ground clip 314 and the end of the cable 310. The support portion 315 extends between the bend portion 313 and the cable holder 304. The support portion 315 passes through the cable holder 304. In an exemplary embodiment, the cables 310 are arranged in an inner row, an outer row, and at least one intermediate row. The cables 310 in the inner row are terminated to the circuit card 302 closest to the cable holder 304. The cables 310 in the outer row are terminated to the circuit card 302 furthest from the cable holder 304. The end portions 311 of the cables 310 in the inner row are shorter than the end portions 311 of the cables 310 in the outer row. The support portions 315 of the cables 310 in the inner row are shorter than the support portions 315 of the cables 310 in the outer row. The bend portions 313 of the cables 310 in the inner row are located closer to the cable holder 304 than the bend portions 313 of the cables 310 in the outer row. The bend portions 313 of the cables 310 in the inner row are located at an elevation lower than the bend portions 313 of the cables 310 in the outer row.

In various embodiments, the cables 310 may be surrounded by epoxy or hot melt forward of the cable supports 390 as a strain relief for the cables 310. The cable supports 390 may form a dam to form the strain relief against. In other embodiments, the cables 310 may be in open air forward of the cable supports 390, such as to improve signal integrity at the cable termination area compared to embodiments having epoxy or hot melt around the cables 310. The cable supports 390 may form a dam to allow epoxy or hot melt to form around the cables 310 rearward of the cable supports 390, such as to enhance the strain relief provided by the cable supports 390.

Figure 6:
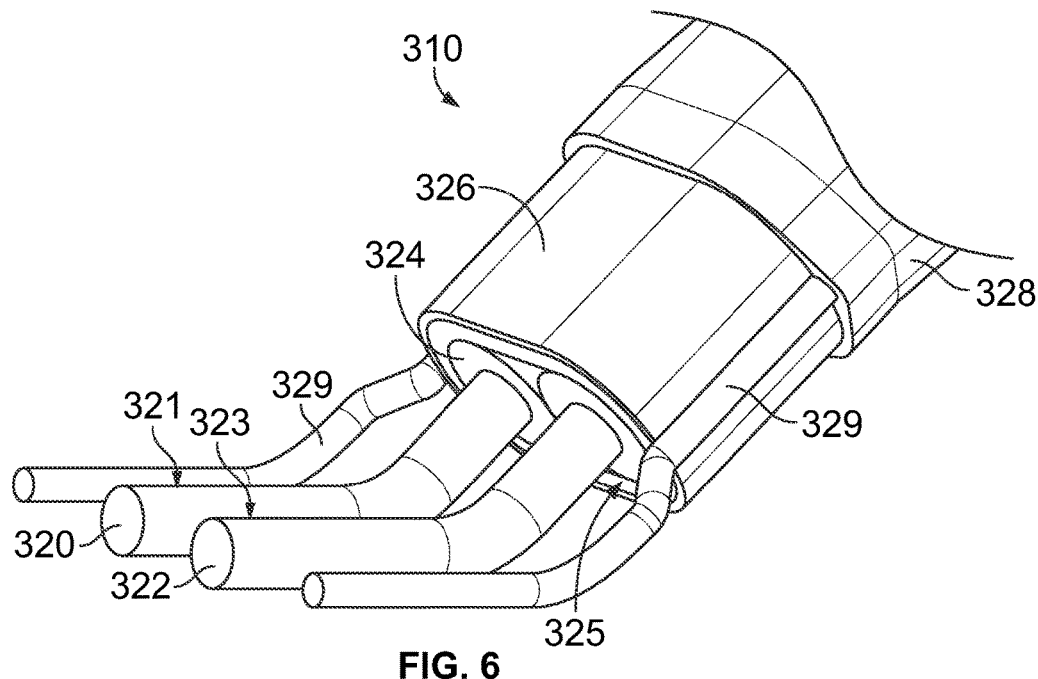
FIG. 6 is a perspective view of the cable in accordance with an exemplary embodiment.

FIG. 6 is a perspective view of the cable 310 in accordance with an exemplary embodiment. The cable 310 includes at least one signal conductor and a shield structure providing electrical shielding for the at least one signal conductor. In an exemplary embodiment, the cables 310 are twin-axial cables. For example, each cable 310 includes a first signal conductor 320 and a second signal conductor 322. The signal conductors 320, 322 carry differential signals. The cable 310 includes an insulator 324 surrounding the signal conductors 320, 322 and a cable shield 326 surrounding the insulator 324. In various embodiments, the insulator 324 includes a single core surrounding both signal conductors 320, 322. In other various embodiments, the insulator 324 is a dual core insulator having a first dielectric element surrounding the first signal conductor 320 and a second dielectric element surrounding the second signal conductor 322. The cable shield 326 provides circumferential shielding around the signal conductors 320, 322. The cable 310 includes a cable jacket 328 surrounding the cable shield 326. In various embodiments, the cable 310 includes one or more drain wires 329 electrically connected to the cable shield 326, such as a pair of drain wires 329 extending along opposite sides of the cable 310, such as between the cable shield 326 and the cable jacket 328. The drain wire(s) 329 are configured to be terminated to the circuit card 302, such as being soldered to contact pads of the circuit card 302. In an exemplary embodiment, the drain wires 329 are configured to be electrically connected to the ground clip 314 (shown in FIG. 5).

In an exemplary embodiment, at an end of the cable 310, the cable jacket 328, the cable shield 326, and the insulator 324 may be removed (e.g., stripped) to expose portions of the signal conductors 320, 322. Exposed portions 321, 323 of the signal conductors 320, 322 extend forward from an end 325 of the insulator. The exposed portions 321, 323 are configured to be mechanically and electrically coupled (e.g., soldered) to corresponding contact pads 384 on the circuit card 302 (shown in FIG. 5). The exposed portions 321, 323 may be bent, such as bent inward toward each other (distance between reduced for tighter coupling and smaller trace spacing) and/or may be bent to extend along the surface of the circuit card 302 to terminate to the contact pads 384.

Figure 7:
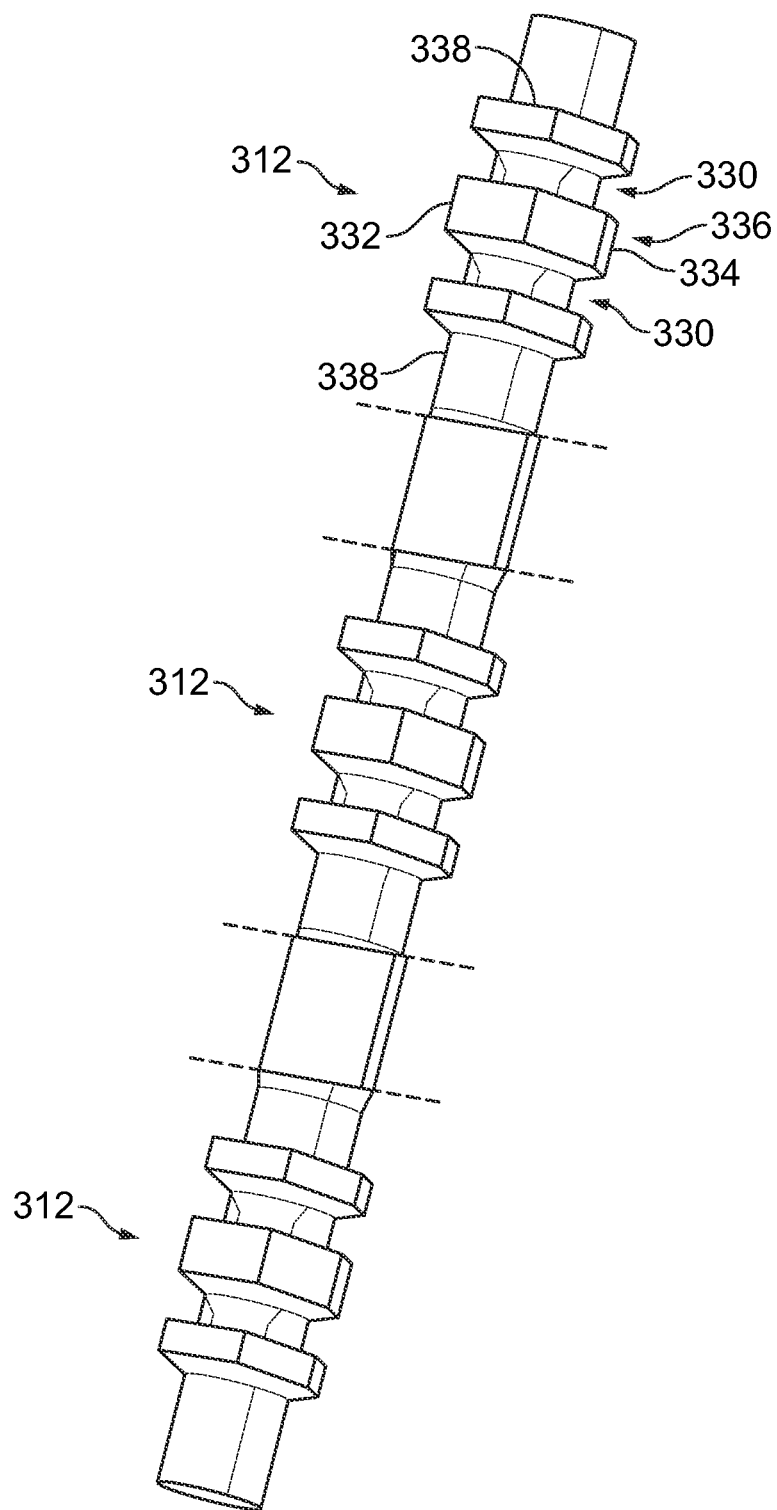
FIG. 7 is a perspective view of the conductor support in accordance with an exemplary embodiment.

FIG. 7 is a perspective view of the conductor support 312 in accordance with an exemplary embodiment. Optionally, multiple conductor supports 312 may be combined to form a unitary structure. For example, FIG. 7 illustrates the conductor support for three cables 310 as a unitary structure. It should be understood that a single conductor support 312 for a single cable 310 may be utilized in alternative embodiments. The conductor support 312 includes a dielectric body used to hold the exposed portions 321, 323 of the signal conductors 320, 322 (shown in FIG. 6). The conductor support 312 electrically isolates the signal conductors 320, 322 from each other and from the ground clip 314 (shown in FIG. 5).

The conductor support 312 includes conductor channels 330 that receive the signal conductors 320, 322. The conductor channels 330 extend between a front and a rear of the conductor support 312. The conductor channels 330 position the signal conductors 320, 322 relative to each other. The conductor channels 330 may pass straight through the conductor support 312 between the front and the rear. However, in alternative embodiments, the conductor channels 330 may be curved or angled to change relative positions of the signal conductors 320, 322 between the front and the rear. For example, the conductor channels 330 may be closer together at the front and further apart at the rear. The conductor channels 330 may be open at the top or at the bottom of the conductor support 312 to receive the signal conductors 320, 322 through the top side or the bottom side of the conductor support 312. Alternatively, the signal conductors 320, 322 may be fed into the conductor channels 330 through the rear of the conductor support 312.

The conductor support 312 includes a rear wall 332 at the rear of the conductor support 312. The rear wall 332 is configured to face the end 325 of the insulator 324 (shown in FIG. 6). The rear wall 332 may abut against the insulator 324. The conductor support 312 includes a nose cone 334 at a front portion 336 of the conductor support 312. The nose cone 334 at the front portion 336 is configured to be received in the ground clip 314. The conductor channels 330 pass through the front portion 336. In an exemplary embodiment, side walls 338 of the conductor support 312 may be angled inward from the rear wall 332 to the nose cone 334.

In various embodiments, conductor supports 312 of multiple cable assemblies 300 may be molded together as a unitary structure. By molding the conductor supports 312 together, the spacing between the cable assemblies 300 may be controlled by the conductor supports 312.

Figure 8:
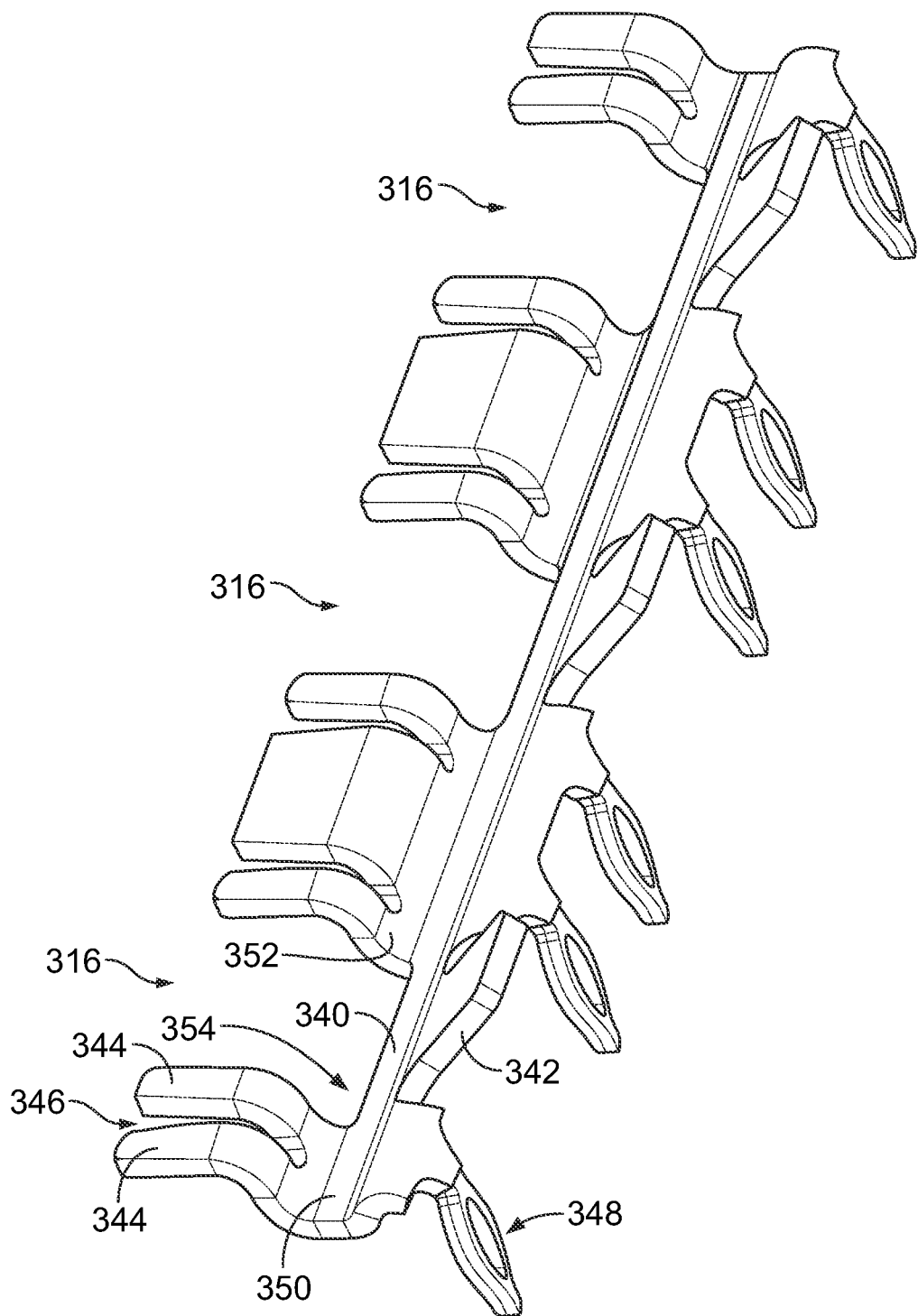
FIG. 8 is a perspective view of the bottom ground rake in accordance with an exemplary embodiment.

FIG. 8 is a perspective view of the bottom ground rake 316 in accordance with an exemplary embodiment. Optionally, multiple bottom ground rakes 316 may be combined to form a unitary structure. For example, FIG. 8 illustrates the bottom ground rake for three cables 310 as a unitary structure. It should be understood that a single bottom ground rake 316 for a single cable 310 may be utilized in alternative embodiments. The bottom ground rake 316 is used as a mechanical and electrical connector between the cable 310 and the circuit card 302 (shown in FIG. 5). The bottom ground rake 316 is manufactured from a conductive material, such as a metal material. In an exemplary embodiment, the bottom ground rake 316 is stamped and formed from a metal plate into a shape configured to mechanically and electrically connect the cable 310 to the circuit card 302. The bottom ground rake 316 is configured to be electrically connected to the cable shield 326 of the cable 310. The bottom ground rake 316 is configured to be electrically connected to the circuit card 302.

The bottom ground rake 316 includes a support wall 340 used to support the cable 310. The bottom ground rake 316 includes a lower grounding tab 342 extending from the support wall 340. The lower grounding tab 342 is configured to be electrically connected to the cable 310, such as to a lower portion of the cable shield 326. The lower grounding tab 342 includes a generally planar inner surface that faces the lower portion of the cable shield 326. The lower grounding tab 342 has a large surface area for electrical connection with the cable shield 326. In various embodiments, the inner surface of the lower grounding tab 342 may be directly coupled to the lower portion of the cable shield 326 to create a DC electrical connection with the cable shield 326. In other embodiments, the inner surface of the lower grounding tab 342 may be spaced apart from, but located in close proximity to, the lower portion of the cable shield 326 to create a capacitive electrical connection between the lower grounding tab 342 and the cable shield 326.

The bottom ground rake 316 includes side connecting tines 344 configured to be electrically connected to the sides of the cable 310. In various embodiments, the side connecting tines 344 may be directly connected to the cable shield 326 at the sides of the cable 310, such as being soldered or compression coupled to the cable shield 326 at the sides of the cable 310. Alternatively, the side connecting tines 344 may be located in close proximity to the sides of the cable shield 326 to create a capacitive electrical connection between the side connecting tines 344 and the cable shield 326. However, in alternative embodiments, the side connecting tines 344 may be electrically connected to the sides of the cable 310 via the drain wires 329. For example, the side connecting tines 344 may be drain wire tines and may be referred to hereinafter as drain wire tines 344. The drain wire tines 344 extending from the support wall 340 for electrical connection to the drain wires 329 of the cable 310. For example, the drain wire tines 344 may be provided at both sides of the support wall 340 to connect with both drain wires 329. In an exemplary embodiment, drain wire slots 346 are defined between pairs of the drain wire tines 344 that receive the drain wires 329. The drain wire tines 344 may be connected to the drain wires 329 by an interference fit. Alternatively, the drain wire tines 344 may be soldered to the drain wires 329. The drain wires 329 create direct electrical paths between the bottom ground rake 316 and the cable shield 326. For example, the drain wires 329 are directly coupled to (DC electrical connection) the drain wire tines 344 and to the cable shield 326.

The bottom ground rake 316 includes one or more mounting tabs 348 extending from the support wall 340. The mounting tabs 348 are used to mount the bottom ground rake 316 to the circuit card 302. In the illustrated embodiment, the mounting tabs 348 are compliant pins, such as eye-of-the-needle pins, configured to be press fit into plated vias of the circuit card 302. In alternative embodiments, the mounting tabs 348 may be solder tabs configured to be soldered to the circuit card 302.

In an exemplary embodiment, the support wall 340 includes a lower panel 350 and a support panel 352. The lower panel 350 and the support panel 352 form a pocket that receives the conductor support 312 and the end of the cable 310. The lower panel 350 defines a base of the support wall 340 that is configured to be mounted to the circuit card 302. For example, the lower panel 350 is configured to rest on the upper surface of the circuit card 302. The support panel 352 extends forward and upward at an angle from the lower panel 350. The support panel 352 supports the front of the conductor support 312 and the end of the cable 310. The lower panel 350 supports the bottom of the conductor support 312.

In an exemplary embodiment, the lower grounding tab 342 extends rearward and upward from the lower panel 350 at an angle, which may define the cable exit direction for the cable 310 from the bottom ground rake 316. For example, the lower grounding tab 342 may be angled transverse (for example, non-parallel) to the lower panel 350 to extend along the cable 310. In various embodiments, the lower grounding tab 342 may be angled at between 30° and 60° relative to the lower panel 350 (horizontal), such as approximately 45°. The mounting tabs 348 extend rearward from the lower panel 350 for connection to the circuit card 302. The drain wire tines 344 extend forward from the lower panel 350 and/or the support panel 352.

In an exemplary embodiment, the support panel 352 is angled transverse (for example, non-parallel) relative to the lower panel 350. For example, the support panel 352 may be angled at between 30° and 60° relative to the lower panel 350, such as approximately 45°. The angles of the panels 350, 352 control the cable exit angle from the bottom ground rake 316 and thus the circuit card 302. For example, the plane defined by the support panel 352 defines the angle of the end 325 of the insulator 324 of the cable 310. The cable 310 extends from the bottom ground rake 316 in a cable exit direction that is perpendicular to the plane of the support panel 352.

In an exemplary embodiment, the support panel 352 includes a window 354 therethrough. The window 354 is configured to receive the signal conductors 320, 322. The window 354 is configured to receive the nose cone 334 at the front portion 336 of the conductor support 312. Optionally, the window 354 is open at a top of the support panel 352. The drain wire tines 344 and the drain wire slots 346 are located on opposite sides of the support panel 352.

Figure 9:
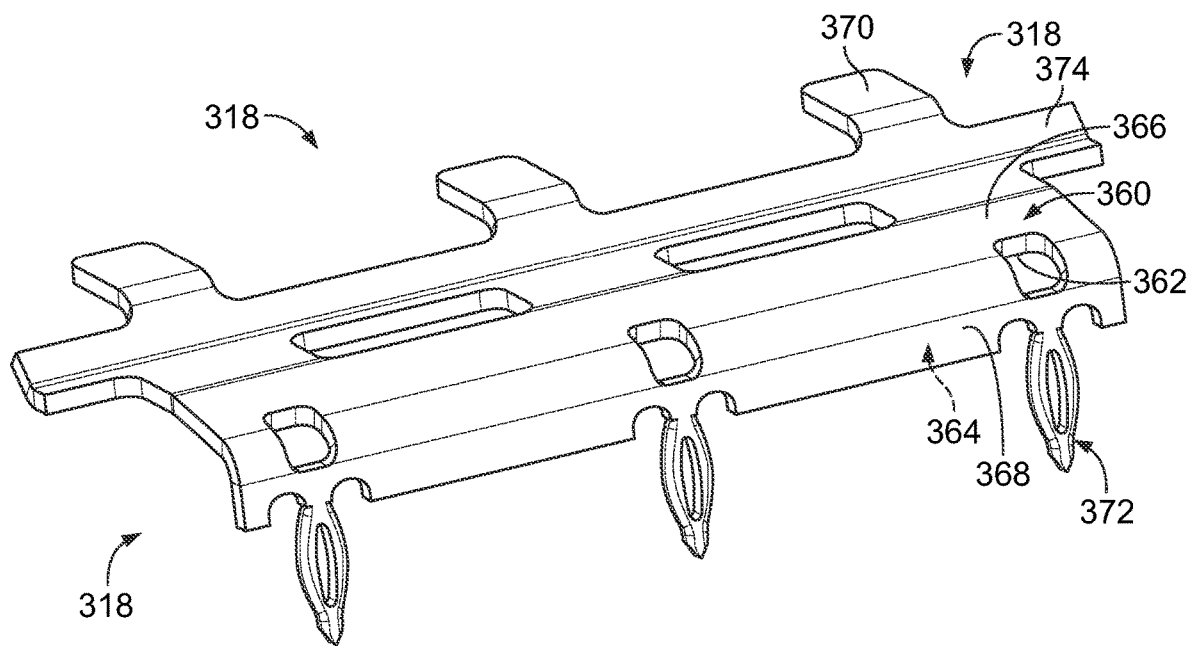
FIG. 9 is a perspective view of the top ground hood in accordance with an exemplary embodiment.

FIG. 9 is a perspective view of the top ground hood 318 in accordance with an exemplary embodiment. Optionally, multiple top ground hoods 318 may be combined to form a unitary structure. For example, FIG. 9 illustrates the top ground hood for three cables 310 as a unitary structure. It should be understood that a single top ground hood 318 for a single cable 310 may be utilized in alternative embodiments. The top ground hood 318 is used as a mechanical and electrical connector between the cable 310 and the circuit card 302 (shown in FIG. 5). The top ground hood 318 is manufactured from a conductive material, such as a metal material. In an exemplary embodiment, the top ground hood 318 is stamped and formed from a metal plate into a shape configured to mechanically and electrically connect the cable 310 to the circuit card 302. The top ground hood 318 is configured to be electrically connected to the cable shield 326 of the cable 310. The top ground hood 318 is configured to be electrically connected to the circuit card 302.

The top ground hood 318 includes a cover 360 used to shield the termination area of the cable 310 to the circuit card 302. The cover 360 has an inner surface 362 that defines a shield pocket 364. The exposed portions of the signal conductors extend into the shield pocket 364 for termination to the circuit card 302. In an exemplary embodiment, the cover 360 includes an upper cover panel 366 above the shield pocket 364 and a front cover panel 368 forward of the shield pocket 364.

The top ground hood 318 includes an upper grounding tab 370 extending from the cover 360. The upper grounding tab 370 is configured to be electrically connected to the cable 310, such as to an upper portion of the cable shield 326. The upper grounding tab 370 includes a generally planar inner surface that faces the upper portion of the cable shield 326. The upper grounding tab 370 has a large surface area for electrical connection with the cable shield 326. In various embodiments, the inner surface of the upper grounding tab 370 may be directly coupled to the upper portion of the cable shield 326 to create a DC electrical connection with the cable shield 326. In other embodiments, the inner surface of the upper ground tab 370 may be spaced apart from, but located in close proximity to, the upper portion of the cable shield 326 to create a capacitive electrical connection between the upper grounding tab 370 and the cable shield 326.

In an exemplary embodiment, the upper grounding tab 370 extends rearward and upward from the upper cover panel 366 at an angle, which may define the cable exit direction for the cable 310 from the top ground hood 318. For example, the upper grounding tab 370 may be angled transverse (for example, non-parallel) to the upper cover panel 366 (horizontal) to extend along the cable 310. In various embodiments, the upper grounding tab 370 may be angled at between 30° and 60° relative to the upper cover panel 366, such as approximately 45°.

The top ground hood 318 includes one or more mounting tabs 372 extending from the cover 360. The mounting tabs 372 are used to mount the top ground hood 318 to the circuit card 302. In the illustrated embodiment, the mounting tabs 372 are compliant pins, such as eye-of-the-needle pins, configured to be press fit into plated vias of the circuit card 302. In alternative embodiments, the mounting tabs 372 may be solder tabs configured to be soldered to the circuit card 302. In the illustrated embodiment, the mounting tabs 372 extend from the bottom edge of the front cover panel 368 for connection to the circuit card 302.

In an exemplary embodiment, the top ground hood 318 including one or more connecting tabs 374 extending from the cover 360. The connecting tabs 374 are used to mechanically and electrically connect the top ground hood 318 to the bottom ground rake 316. In the illustrated embodiment, the connecting tabs 374 extend from the sides of the cover 360. The connecting tabs 374 are configured to be soldered or welded to the bottom ground rake 316, such as to the support wall 340 or drain wire tines 344.

Figure 10:
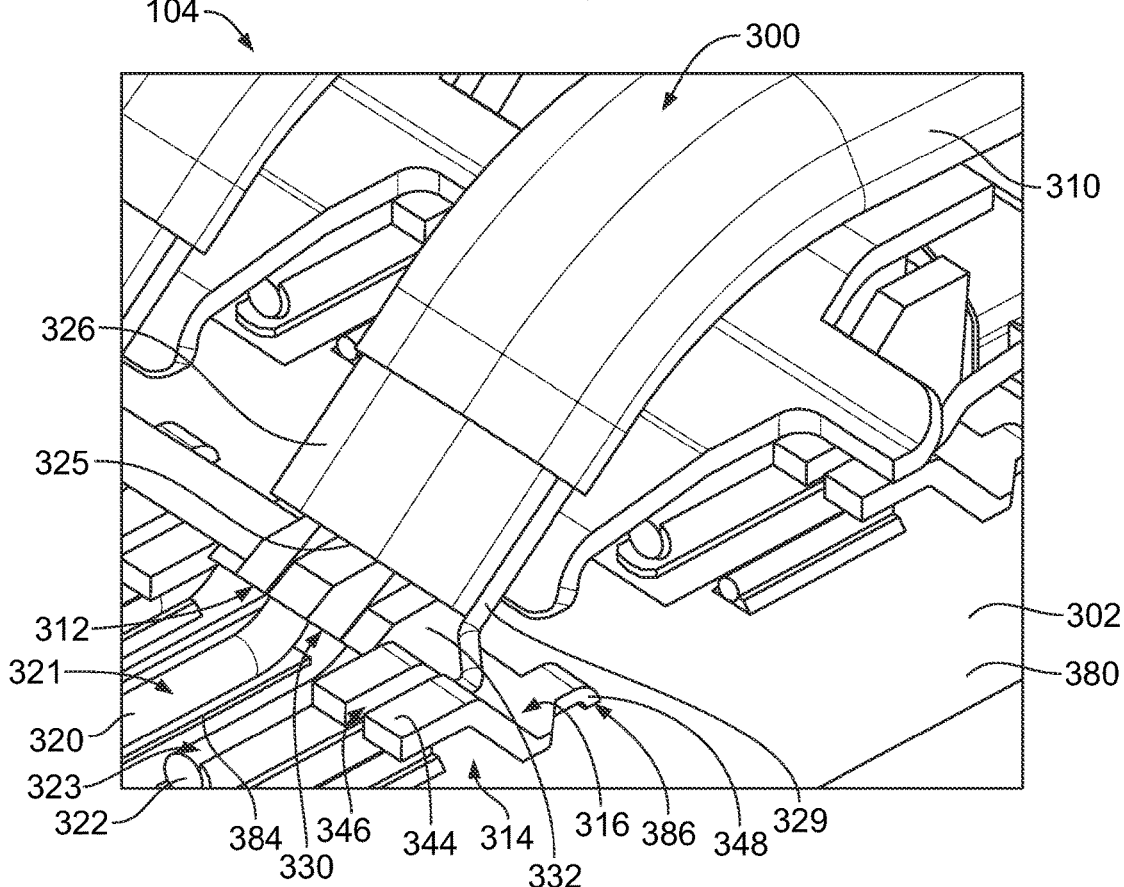
FIG. 10 is a perspective view of a portion of the cable connector module in accordance with an exemplary embodiment.

FIG. 10 is a perspective view of a portion of the cable connector module 104 in accordance with an exemplary embodiment. FIG. 10 shows the cable connector module 104 during an intermediate stage of assembly. During assembly, the cable assemblies 300 are coupled to the circuit card 302. In various embodiments, the bottom ground rake 316 and/or the conductor support 312 may be coupled to the end of the cable 310 prior to coupling the bottom ground rake 316 and the conductor support 312 to the circuit card 302. However, in alternative embodiments, the bottom ground rake 316 and the conductor support 312 may be coupled to the circuit card 302 prior to coupling the end of the cable 310 to the bottom ground rake 316 and the conductor support 312.

During assembly, the exposed portions 321, 323 of the signal conductors 320, 322 are coupled to the conductor support 312. The signal conductors 320, 322 are loaded into the conductor channels 330. For example, the conductor channels 330 may be open at the top of the conductor support 312 such that the signal conductors 320, 322 may be loaded into the conductor channels 330 from above. The rear wall 332 faces, and may abut against, the end 325 of the insulator 324. In an exemplary embodiment, the cable 310 extends away from the conductor support 312 in a cable exit direction. The angle of the rear wall 332 (relative to the circuit card 302) controls the cable exit direction relative to the circuit card 302. For example, the cable exit direction may be perpendicular to the rear wall 332. The conductor support 312 may be used to support the drain wires 329. The dielectric material of the conductor support 312 controls impedance along the signal paths. In various embodiments, the conductor support 312 is made of low loss material to decrease insertion loss along the signal paths.

In various embodiments, the conductor support 312 may be coupled to the bottom ground rake 316 of the ground clip 314. For example, the bottom ground rake 316 may position and support the conductor support 312 to position the conductor support 312 relative to the circuit card 302 to control the position and orientation of the cable 310 (for example, to control the cable exit direction). Optionally, the conductor support 312 may be pre-formed separate from the bottom ground rake 316, such as being molded separate from the bottom ground rake 316. The conductor support 312 is then coupled to the bottom ground rake 316, such as being press-fit into the ground clip and held by an interference fit. The conductor support 312 may be secured to the bottom ground rake 316 using adhesive, fasteners, clips or other securing means.

The signal conductors 320, 322 may be loaded into the conductor support 312 prior to coupling to the bottom ground rake 316. Alternatively, the signal conductors 320, 322 may be loaded into the conductor support 312 after the conductor support 312 is coupled to the bottom ground rake 316.

In alternative embodiments, the conductor support 312 may be formed in place on the bottom ground rake 316 rather than being separately manufactured and then assembled with the bottom ground rake 316. For example, the conductor support 312 may be overmolded over a portion of the bottom ground rake 316. The conductor support 312 is molded to the bottom ground rake 316 to fix the position of the conductor support 312 relative to the bottom ground rake 316.

In various embodiments, the conductor support 312 of multiple cable assemblies 300 may be integrated as a unitary, monolithic structure. For example, the conductor supports 312 may be co-molded together, which controls spacing and relative positioning of the cables 310. In various embodiments, the conductor supports 312 may be overmolded over the bottom ground rakes 316 to control relative positioning of the bottom ground rakes 316 of multiple cable assemblies 300.

When assembled, the exposed portions 321, 323 of the conductors 320, 322 extend forward of the conductor support 312, such as for termination to the circuit card 302. The drain wires 329 pass through the drain wire slots 346 forward of the bottom ground rake 316 for termination to the circuit card 302. The drain wires 329 may be held in the drain wire slots 346 by an interference fit to electrically connect the drain wires 329 to the bottom ground rake 316. Alternatively, the drain wires 329 may be soldered to the drain wire tines 344 to electrically connect the drain wires 329 to the bottom ground rake 316. The drain wires 329 connect the bottom ground rake 316 to the cable shield 326, such as to opposite sides (right side and left side) of the cable 310.

During assembly, the mounting tabs 348 of the bottom ground rake 316 are coupled to the circuit card 302. For example, the mounting tabs 348 may be press-fit into the ground vias 386. Alternatively, the mounting tabs 348 may be soldered to corresponding circuits of the circuit card 302.

During assembly, the exposed portions 321, 323 of the signal conductors 320, 322 are coupled to the corresponding contact pads 384 at the upper surface 380 of the circuit card 302. For example, the signal conductors 320, 322 are soldered to the contact pads 384. Similarly, the ends of the drain wires 329 are coupled to the corresponding contact pads 384 of the circuit card 302. For example, the drain wires 329 are soldered to the contact pads 384 to connect to a ground plane at the upper surface 380 of the circuit card 302. The drain wires 329 extend along (for example, parallel to and spaced apart from) the exposed portions 321, 323. The drain wires 329 are located between the pairs of exposed portions 321, 323 to provide shielding between the pairs of signal conductors 320, 322. The signal conductors 320, 322 transition from the end of the insulator 324, through the conductor support 312, to the circuit card 302. The exposed portions 321, 323 of the signal conductors 320, 322 are bent at an angle relative to the cable axis to transition to the circuit card 302.

Figure 11:
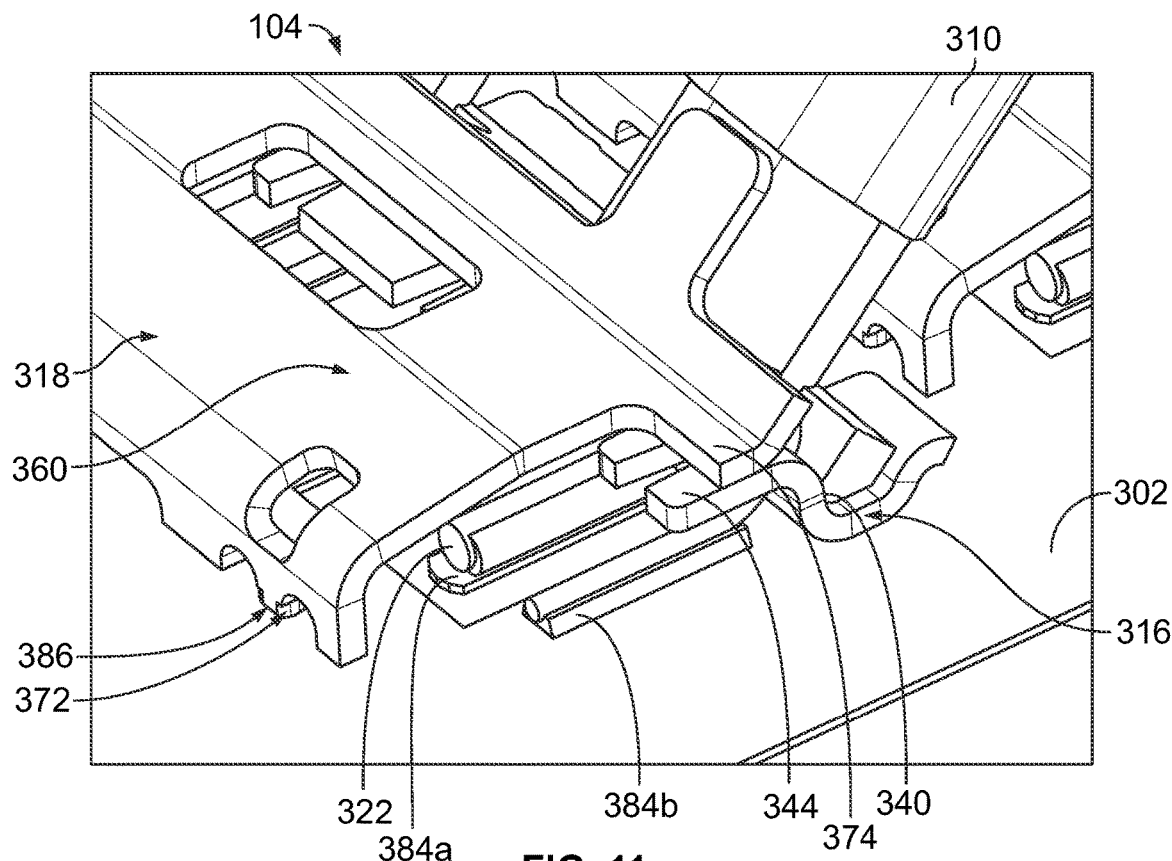
FIG. 11 is a top perspective view of a portion of the cable connector module in accordance with an exemplary embodiment.
Figure 12:
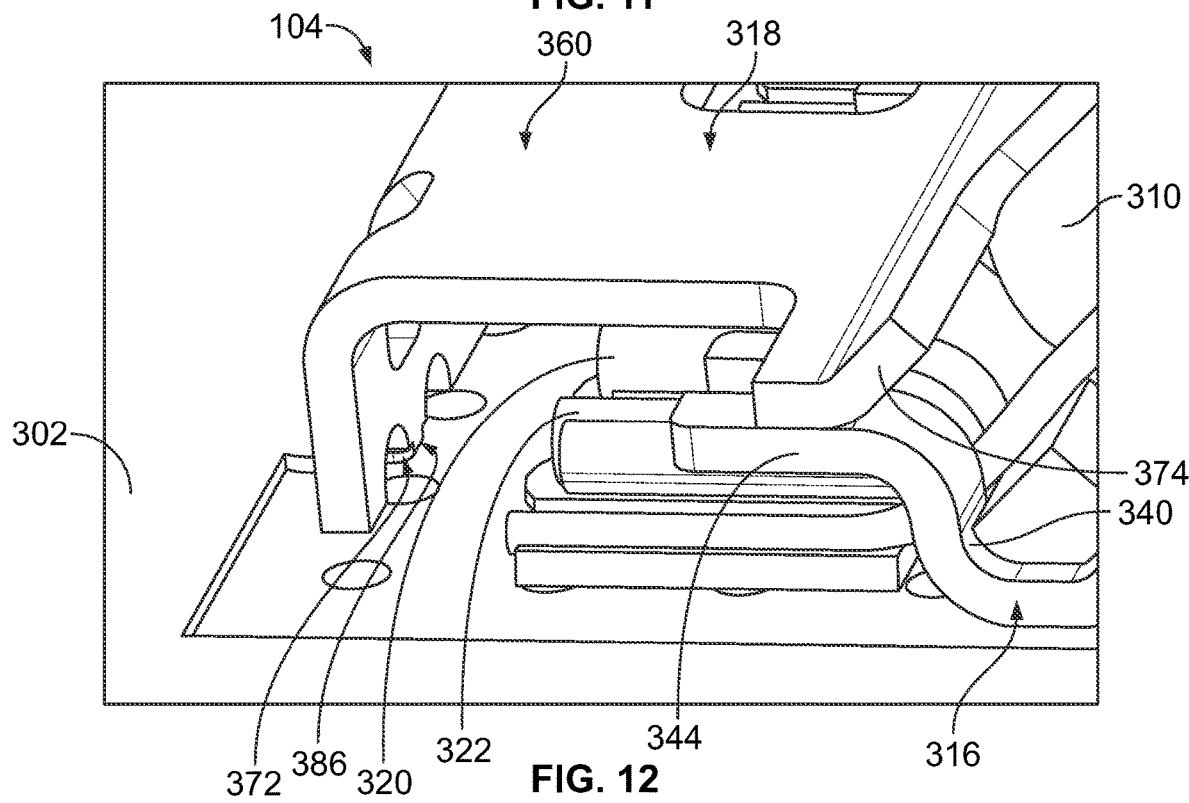
FIG. 12 is a rear perspective view of a portion of the cable connector module in accordance with an exemplary embodiment.

FIG. 11 is a top perspective view of a portion of the cable connector module 104 in accordance with an exemplary embodiment. FIG. 12 is a rear perspective view of a portion of the cable connector module 104 in accordance with an exemplary embodiment. FIGS. 11 and 12 show the top ground hood 318 coupled to the bottom ground rake 316 and the circuit card 302. In an exemplary embodiment, the top ground hood 318 is assembled after the bottom ground rake 316 and the cables 310 are terminated to the circuit card 302.

During assembly, the mounting tabs 372 extending from the cover 360 are coupled to the circuit card 302. For example, the mounting tabs 372 are press-fit into the ground vias 386. Alternatively, the mounting tabs 372 may be soldered to corresponding circuits of the circuit card 302.

During assembly, the connecting tabs 374 extending from the cover 360 are coupled to the bottom ground rake 316. For example, the connecting tabs 374 are soldered or welded to the bottom ground rake 316, such as to the support wall 340. The support wall 340 and/or the drain wire tines 344 support the rear end of the top ground hood 318, such as to position the top ground hood 318 relative to the conductors 320, 322. In an exemplary embodiment, the connecting tabs 374 are connected to the drain wire tines 344, such as being welded to the drain wire tines 344.

Figure 13:
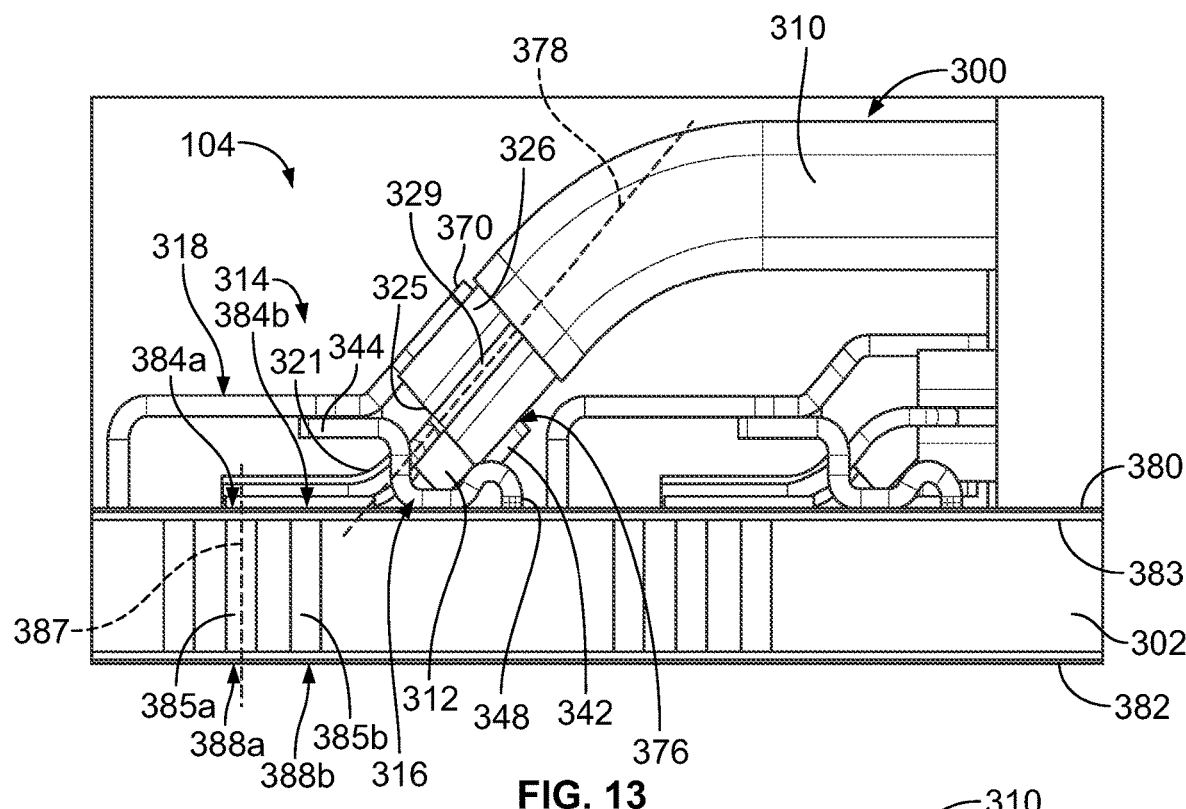
FIG. 13 is a side view of a portion of the cable connector module in accordance with an exemplary embodiment.

FIG. 13 is a side view of a portion of the cable connector module 104 in accordance with an exemplary embodiment. The cable assemblies 300 are coupled to the circuit card 302. The ground clip 314 is coupled to the circuit card 302. The ground clip 314 defines the cable exit angle from the circuit card 302. The ground clip 314 provides electrical shielding for the cable 310 at the termination zone between the cable 310 and the circuit card 302. The ground clip 314 creates an electrical path between the circuit card 302 and the cable shield 326 of the cable 310. For example, the ground clip includes multiple electrical interfaces with the cable shield 326, such as at the upper portion, the lower portion, and both the right and left side portions of the cable shield 326. The electrical interfaces between the ground clip 314 and the cable 310 may be made via solderless connections. For example, the upper and lower connections may be made by direct, interference fit connections or capacitive coupling between the ground clip 314 and the cable shield and the right and left side connections may be made by interference fit connections between the ground clip 314 and the drain wires 329. The multiple connection points are provided around the cable shield 326, such as on all four sides of the cable shield 326 to efficiently common the ground clip 314 and the cable shield 326 allowing efficient operation at high frequencies, such as between DC and 67 GHz. The ground structure allows efficient high-speed operation for the system, such as at 224 Gbps.

The circuit card 302 extends between the upper surface 380 and the lower surface 382. The contact pads 384 are provided at the upper surface 380. The mating pads 388 are provided at the lower surface 382. In an exemplary embodiment, the contact pads 384 include both signal contact pads 384a (FIG. 11) and ground contact pads 384b (FIG. 11). The ground contact pads 384b may be discrete contact pads. In other various embodiments, the ground contact pads 384b may be defined by a ground plane 383 at the upper surface 380. The contact pads 384 are connected to corresponding mating pads 388 by plated vias 385. The plated vias 385 extend through the circuit card 302 between the upper surface 380 and the lower surface 382. The plated vias 385 may be signal vias 385a and ground vias 385b. The signal vias 385a electrically connect the signal contact pads 384a and the signal mating pads 388a. The ground vias 385b electrically connect the ground contact pads 384b and the ground mating pads 388b. In an exemplary embodiment, the signal contact pads 384a and the signal mating pads 388a are arranged in pairs. The ground contact pads 384b, the ground mating pads 388b, and the ground vias 385b surround the signal contact pads 384a, the signal mating pads 388a, and the signal vias 385a, such as forming a ring or fence around the signal pairs.

In an exemplary embodiment, the contact pads 384 and the mating pads 388 are electrically connected only by the plated vias 385. For example, the contact pads 384 and the signal mating pads 388 are electrically connected without circuit traces routed on other layers of the circuit card 302. In an exemplary embodiment, the contact pads 384 are vertically aligned with the corresponding mating pads 388. The plated vias 385 pass vertically through the circuit card 302 along via axes 387. The contact pads 384 and the signal mating pads 388 are coincident with the via axes 387. The plated vias 385 are oriented perpendicular to the upper surface 380 and the lower surface 382. The vias 385 have the shortest length between the contact pad 384 and the corresponding mating pad 388 for high speed signaling through the circuit card 302. The plated vias 385 extend the entire height of the circuit card 302 from the upper surface 380 to the lower surface 382 to connect the contact pads 384 and the mating pads 388.

When assembled, the bottom ground rake 316 and the top ground hood 318 are coupled to the circuit card 302 and form a cable pocket 376 that extends along a cable exit axis 378. The end of the cable 310 is received in the cable pocket 376. The cable 310 extends away from the circuit card 302 in a cable exit direction along the cable exit axis 378. The conductor support 312 is received in the cable pocket 376 and supports the end of the cable 310. The cable pocket 376 is defined between inner surfaces of the lower grounding tab 342 and the upper grounding tab 370. The inner surfaces may be planar surfaces oriented parallel to each other. The lower grounding tab 342 and the upper grounding tab 370 are spaced apart from each other to receive the cable 310 therebetween. The lower grounding tab 342 and the upper grounding tab 370 extend parallel to the cable exit axis 378. The lower grounding tab 342 and the upper grounding tab 370 position the cable 310 and locate the cable 310 along the cable exit axis 378. The lower grounding tab 342 supports the cable 310 from below. The upper grounding tab 370 supports the cable 310 from above.

In various embodiments, the lower grounding tab 342 directly engages the cable shield 326 of the cable 310 to electrically connect (DC electrical connection) the bottom ground rake 316 to the cable shield 326. Additionally, or alternatively, the lower grounding tab 342 is capacitively coupled to the lower portion of the cable shield 326. For example, the lower grounding tab 342 is closely positioned relative to the cable shield 326 but does not physically contact the cable shield 326 (small separation distance). The lower grounding tab 342 may be positioned at most 50 microns apart from the cable shield 326 to create a strongly capacitively coupled connection between the lower grounding tab 342 and the lower portion of the cable shield 326. The large surface area of the lower grounding tab 342 provides an efficient capacitive connection between the lower grounding tab 342 and the cable shield 326. A ground return path is defined between the bottom ground rake 316 and the cable shield 326 through the DC electrical connection or the capacitive connection between the lower grounding tab 342 and the lower portion of the cable shield 326.

In various embodiments, the upper grounding tab 370 directly engages the cable shield 326 of the cable 310 to electrically connect (DC electrical connection) the top ground hood 318 to the cable shield 326. Additionally, or alternatively, the upper grounding tab 370 is capacitively coupled to the upper portion of the cable shield 326. For example, the upper grounding tab 370 is closely positioned relative to the cable shield 326 but does not physically contact the cable shield 326 (small separation distance). The upper grounding tab 370 may be positioned at most 50 microns apart from the cable shield 326 to create a strongly capacitively coupled connection between the upper grounding tab 370 and the upper portion of the cable shield 326. The large surface area of the upper grounding tab 370 provides an efficient capacitive connection between the upper grounding tab 370 and the cable shield 326. A ground return path is defined between the top ground hood 318 and the cable shield 326 through the DC electrical connection or the capacitive connection between the upper grounding tab 370 and the upper portion of the cable shield 326.

In an exemplary embodiment, the lower grounding tab 342 and the upper grounding tab 370 are angled transverse relative to the circuit card 302. For example, the lower grounding tab 342 and the upper grounding tab 370 may be angled between 30° and 60° relative to the (horizontal) circuit card 302. Optionally, the lower grounding tab 342 and the upper grounding tab 370 may be angled at approximately 45°. The lower grounding tab 342 and the upper grounding tab 370 define the cable exit angle at between 30° and 60° relative to the (horizontal) circuit card 302, such as at approximately 45° to immediately lift the cable 310 off of the circuit card 302 and allow tight spacing of the cable assemblies 300 as compared to conventional cable connector modules having the cables oriented generally parallel to the circuit card for termination to the circuit card.

The ground clip 314 is used to mechanically and electrically connect the cable 310 to the circuit card 302. The mounting tabs 348 mechanically secure the ground clip 314 to the circuit card 302 holding the bottom ground rake 316 along the upper surface 380 of the circuit card 302. In an exemplary embodiment, the ground clip 314 is used to direct the cable 310 away from the circuit card 302 at a predetermined cable exit angle. For example, the ground clip 314 may hold the cable 310 at a cable exit angle that is non-parallel to the circuit card 302 and non-perpendicular to the circuit card 302. In various embodiments, the ground clip 314 may hold the cable 310 at a cable exit angle of between 30° and 60°. Optionally, the ground clip 314 may hold the cable 310 at a cable exit angle of approximately 45°.

The ground clip 314 directs the cable 310 away from the upper surface 380 at an angle to allow tight spacing of the cable assemblies 300. For example, the contact pads 384 on the circuit card 302 may be more densely populated (for example, closer spacing) by forcing the cable 310 to exit at an angle from the upper surface 380 of the circuit card 302 as compared to conventional cable connector modules having the cables oriented generally parallel to the circuit card for termination to the circuit card.

In an exemplary embodiment, the ground clip 314 is used to electrically connect to the cable 310, such as to improve electrical performance of the cable connector module 104. For example, the ground clip 314 may reduce excess insertion loss and cross talk due to tighter control of electromagnetic fields at the termination area. The ground clip 314 positions the cable 310 to have a short ground return path between the cable 310 and the circuit card 302 for improved electrical characteristics. For example, the ground return path is defined from the cable shield 326 directly into the ground clip 314 through the drain wires 329 and the drain wire tines 344, and directly from the ground clip 314 to the circuit card 302 through the mounting tabs 348. The drain wire tines 344 may be soldered to the drain wires 329. The drain wire tines 344 and the drain wires 329 provide multiple points of contact with the cable shield 326 at different sides of the cable 310 to reduce insertion loss and crosstalk by controlling electromagnetic fields around the end of the cable 310. The exposed portions 321, 323 of the signal conductors 320, 322 have a short distance from the end 325 of the insulator 324 (shown in FIG. 6) to the contact pads 384. The conductor support 312 tightly controls the impedance in the termination area (between the end 325 of the insulator 324 and the contact pads 384). The ground clip 314 provides shielding in the termination area. For example, the ground clip 314 occupies much of the surrounding space between the end 325 of the insulator 324 and the upper surface 380 of the circuit card 302 to reduce insertion loss and crosstalk by tightly controlling the electromagnetic fields in the termination area.

Figure 14:
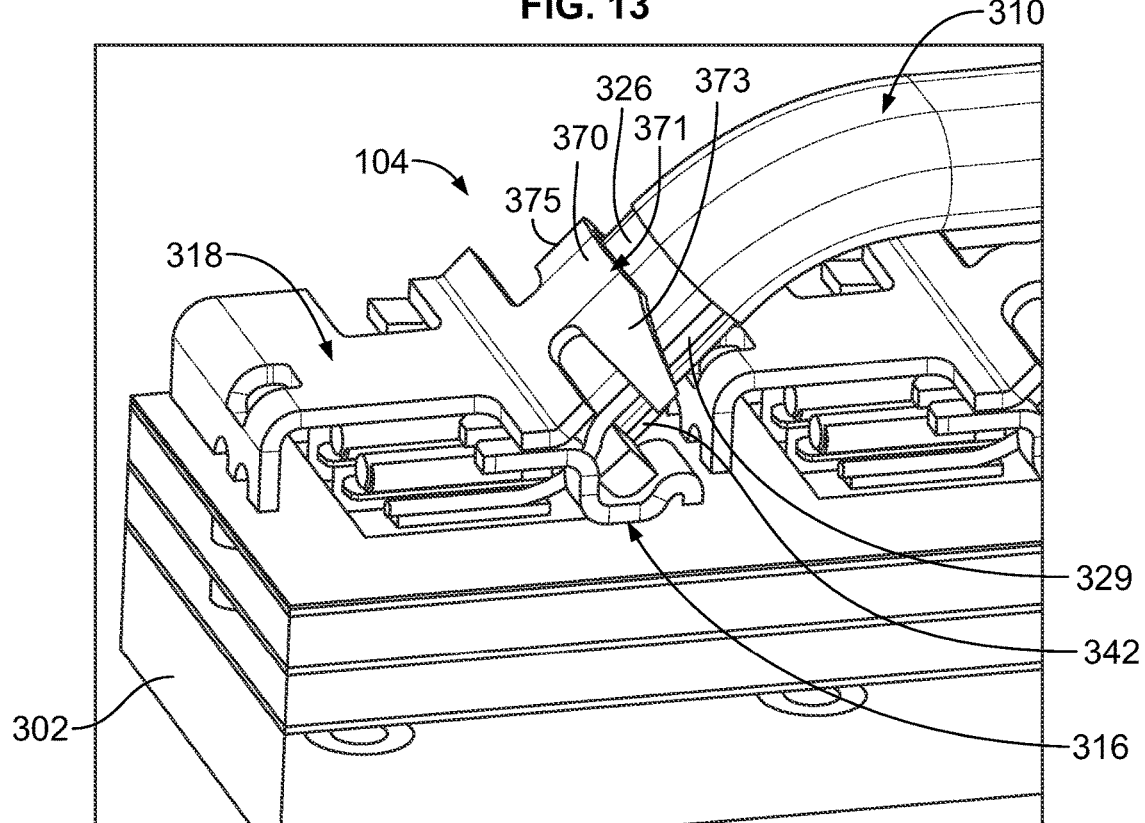
FIG. 14 is a top perspective view of a portion of the cable connector module in accordance with an exemplary embodiment.

FIG. 14 is a top perspective view of a portion of the cable connector module 104 in accordance with an exemplary embodiment. FIG. 14 shows the top ground hood 318 coupled to the bottom ground rake 316 and the circuit card 302. In an exemplary embodiment, the top ground hood 318 includes a cable connector 371 configured to be coupled to the cable 310. The cable connector 371 presses the drain wires 329 toward the cable shield 326.

The cable connector 371 extends from the upper grounding tab 370 and wraps at least partially around the end of the cable 310. In an exemplary embodiment, the cable connector 371 includes connecting fingers 373, 375 at opposite sides of the cable connector 371. The connecting fingers 373, 375 may extend from opposite sides of the upper grounding tab 370. The connecting fingers 373, 375 may be provided at or near the distal end of the upper grounding tab 370.

In an exemplary embodiment, the connecting fingers 373, 375 may be folded or crimped around the sides of the cable 310. The connecting fingers 373, 375 are configured to be coupled to the drain wires 329 at the sides of the cable 310. The connecting fingers 373, 375 may directly engage the exposed portions of the drain wires 329 to electrically connect to the drain wires 329. Optionally, the connecting fingers 373, 375 may directly engage the cable shield 326 to electrically connect to the cable shield 326. The connecting fingers 373, 375 are used to pinch the drain wires 329 inward, such as to hold the drain wires 329 against the cable shield 326. In an exemplary embodiment, the connecting fingers 373, 375 are crimped around the end of the cable 310 to press the drain wires 329 inward toward the cable shield 326. In an exemplary embodiment, the connecting finger 373, 375 extend a majority of a perimeter of the cable 310 between the upper grounding tab 370 and the lower grounding tab 342. The connecting fingers 373, 375 may engage the lower grounding tab 342. The connecting fingers 373, 375 may press the lower grounding tab 342 inward toward the cable shield 326.

In an exemplary embodiment, the connecting fingers 373, 375 may be located proximate to the end of the cable shield 326 to connect the drain wires 329 to the cable shield 326 proximate to the end of the cable shield 326. The connecting fingers 373, 375 prevent lift-off or separation of the drain wires 329 from the cable shield 326, such as to create an improved ground return path from the cable shield 326 to the drain wires 329.

In an exemplary embodiment, the cable connector 371 is integral with the top ground hood 318. For example, the cable connector 371 is stamped and formed with the top ground hood 318 from a common metal sheet. However, in alternative embodiments, the cable connector 371 is separate and discrete from the top ground hood 318. For example, the cable connector 371 may be separately stamped and formed. The cable connector 371 may be coupled to the top ground hood 318, such as to the upper grounding tab 370 and/or the lower grounding tab 342. The cable connector 371 may be soldered or welded to the upper grounding tab 370. In alternative embodiments, the cable connector 371 may be crimped onto the upper grounding tab 370. In various embodiments, the cable connector may be a band wrapped entirely circumferentially around the cable 310 and the grounding tabs 370, 342 to compress the drain wires 329 and the grounding tabs 370, 342 inward toward the cable shield 326, such as to press the drain wires 329 and the grounding tabs 370, 342 into direct contact with the cable shield 326 to create multiple grounding points with the cable shield 326.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A cable connector module comprising:
a circuit card having an upper surface and a lower surface, the circuit card including signal contact pads on the upper surface, the circuit card including signal mating pads on the lower surface, the signal mating pads configured to be mated with interposer contacts of a socket connector, the circuit card including signal vias extending directly through the circuit card between the upper and lower surface to electrically connect the signal contact pads and the corresponding signal mating pads in the shortest path possible; and
cable assemblies terminated to the upper surface of the circuit card, each cable assembly including a cable having an insulator holding a first signal conductor and a second signal conductor, the cable having a cable shield surrounding the insulator, the first and second signal conductors having exposed portions extending forward of an end of the insulator at an end of the cable, and each cable assembly including a ground structure that is configured to be mounted to the circuit card to electrically connect the cable shield to the circuit card.

2. The cable connector module of claim 1, wherein the signal contact pads are vertically aligned with the corresponding signal mating pads.

3. The cable connector module of claim 1, wherein the signal contact pads and the signal mating pads are electrically connected only by the signal vias.

4. The cable connector module of claim 1, wherein the signal contact pads and the signal mating pads are electrically connected without circuit traces therebetween.

5. The cable connector module of claim 1, wherein the signal vias are plated vias passing vertically through the circuit card.

6. The cable connector module of claim 1, wherein the signal vias extend from the upper surface to the lower surface to connect the signal contact pads and the signal mating pads.

7. The cable connector module of claim 1, wherein the signal vias extend along via axes, the signal contact pads and the signal mating pads being coincident with the via axes.

8. The cable connector module of claim 1, wherein the circuit card includes ground contact pads on the upper surface and ground mating pads on the lower surface, the circuit card including ground vias extending through the circuit card between the upper and lower surface to electrically connect the ground contact pads and the ground mating pads, the ground structure being electrically connected to the ground contact pads, the ground vias being electrically commoned by at least one ground plane.

9. The cable connector module of claim 1, wherein the grounding structure extends in a cable exit direction angled transverse to a mounting surface of the circuit card at an angle of between 30° and 60° relative to the upper surface of the circuit card.

10. The cable connector module of claim 1, wherein the grounding structure includes a bottom ground rake below the cable and a top ground hood above the cable, the top ground hood being separate and discrete from the bottom ground rake and coupled to the bottom ground rake, the bottom ground rake including a lower grounding tab being electrically connected to a lower portion of the cable shield, the top ground hood including an upper grounding tab being electrically connected to an upper portion of the cable shield, the ground clip including a cable pocket between the lower grounding tab and the upper grounding tab, the cable pocket extends in a cable exit direction angled transverse relative to the mounting surface of the circuit card.

11. A cable connector module comprising:
a circuit card having an upper surface and a lower surface, the circuit card including signal contact pads on the upper surface, the circuit card including ground contact pads on the upper surface, the circuit card including signal mating pads on the lower surface, the circuit card including ground mating pads on the lower surface, the signal mating pads and the ground mating pads configured to be mated with interposer contacts of a socket connector, the circuit card including signal vias extending directly through the circuit card between the upper and lower surface to electrically connect the signal contact pads and the corresponding signal mating pads in the shortest path possible, the circuit card including ground vias extending directly through the circuit card between the upper and lower surface to electrically connect the ground contact pads and the ground mating pads in the shortest path possible; and
cable assemblies terminated to the upper surface of the circuit card, each cable assembly including a cable and a ground clip coupled to an end of the cable, the ground clip coupling the cable to the upper surface of the circuit card, the cable having an insulator holding a first signal conductor and a second signal conductor, the cable having a cable shield surrounding the insulator, the first and second signal conductors having exposed portions extending forward of an end of the insulator at an end of the cable electrically connected to corresponding signal contact pads, the ground clip including a mounting tab configured to be mounted to the circuit card to fix the ground clip relative to the circuit card and electrically connect the ground clip to the corresponding ground contact pad of the circuit card.

12. The cable connector module of claim 11, wherein the signal contact pads are vertically aligned with the corresponding signal mating pads.

13. The cable connector module of claim 11, wherein the signal contact pads and the signal mating pads are electrically connected only by the signal vias.

14. The cable connector module of claim 11, wherein the signal vias extend along via axes from the upper surface to the lower surface to connect the signal contact pads and the signal mating pads, the signal contact pads and the signal mating pads being coincident with the via axes.

15. The cable connector module of claim 11, wherein the ground clip includes a lower grounding tab being electrically connected to a lower portion of the cable shield and an upper grounding tab being electrically connected to an upper portion of the cable shield, the ground clip including a cable pocket between the lower grounding tab and the upper grounding tab, the cable pocket extends in a cable exit direction, the cable exit direction angled transverse to a mounting surface of the circuit card at an angle of between 30° and 60° relative to the upper surface of the circuit card.

16. The cable connector module of claim 11, wherein the ground clip includes a bottom ground rake below the cable and a top ground hood above the cable, the top ground hood being separate and discrete from the bottom ground rake and coupled to the bottom ground rake, the bottom ground rake including a lower grounding tab, the top ground hood including an upper grounding tab, a cable pocket defined between the bottom ground rake and the top ground hood that receives the cable and supports the cable at a cable exit direction angled transverse relative to the upper surface of the circuit card.

17. A cable connector module comprising:
a housing having a cavity;
a circuit card held by the housing, the circuit card having an upper surface and a lower surface, the circuit card including signal contact pads on the upper surface, the circuit card including signal mating pads on the lower surface, the signal mating pads configured to be mated with interposer contacts of a socket connector, the circuit card including signal vias extending through the circuit card between the upper and lower surface to electrically connect the signal contact pads and the corresponding signal mating pads; and
cable assemblies terminated to the upper surface of the circuit card, each cable assembly including a cable and a ground clip coupled to an end of the cable, the ground clip coupling the cable to the upper surface of the circuit card, the cable having an insulator holding a first signal conductor and a second signal conductor, the cable having a cable shield surrounding the insulator, the first and second signal conductors having exposed portions extending forward of an end of the insulator at an end of the cable electrically connected to corresponding signal contact pads, the ground clip being mounted to the circuit card to fix the ground clip relative to the circuit card and electrically connect the ground clip to the circuit card, the ground clip supports the cable in a cable exit direction angled transverse relative to the mounting surface of the circuit card.

18. The cable connector module of claim 17, wherein the signal contact pads are vertically aligned with the corresponding signal mating pads.

19. The cable connector module of claim 17, wherein the signal vias extend along via axes from the upper surface to the lower surface to connect the signal contact pads and the signal mating pads, the signal contact pads and the signal mating pads being coincident with the via axes.

20. The cable connector module of claim 17, wherein the ground clip includes a lower grounding tab being electrically connected to a lower portion of the cable shield and an upper grounding tab being electrically connected to an upper portion of the cable shield, the ground clip including a cable pocket between the lower grounding tab and the upper grounding tab, the cable pocket extends in a cable exit direction, the cable exit direction angled transverse to a mounting surface of the circuit card at an angle of between 30° and 60° relative to the upper surface of the circuit card.

* * * * *